(12) United States Patent
Liao et al.

(10) Patent No.: US 10,283,443 B2
(45) Date of Patent: May 7, 2019

(54) CHIP PACKAGE HAVING INTEGRATED CAPACITOR

(71) Applicant: TAIWAN SEMICONDUCTOR MANUFACTURING CO., LTD., Hsinchu (TW)

(72) Inventors: Wen-Shiang Liao, Miaoli County (TW); Chewn-Pu Jou, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/474,700

(22) Filed: Mar. 30, 2017

(65) Prior Publication Data
US 2017/0207147 A1    Jul. 20, 2017

Related U.S. Application Data

(60) Continuation-in-part of application No. 14/996,070, filed on Jan. 14, 2016, now Pat. No. 9,941,195, which
(Continued)

(51) Int. Cl.
*H01L 23/498*    (2006.01)
*H01L 23/538*    (2006.01)
(Continued)

(52) U.S. Cl.
CPC .... *H01L 23/49822* (2013.01); *H01L 23/5389* (2013.01); *H01L 24/19* (2013.01);
(Continued)

(58) Field of Classification Search
CPC ............. H01L 23/485; H01L 23/49822; H01L 23/5389; H01L 24/19; H01L 24/20;
(Continued)

(56) References Cited

U.S. PATENT DOCUMENTS

| 5,245,505 A | 9/1993 | Shiga et al. |
| 5,583,359 A | 12/1996 | Ng et al. |

(Continued)

FOREIGN PATENT DOCUMENTS

| TW | 200839990 A | 10/2008 |
| TW | 201104770 A | 2/2011 |

(Continued)

OTHER PUBLICATIONS

Chen et al., High-Performance MIM Capacitor Using ZrO2/Al2O3/ZrO2 Dielectric, The Electrochemical Society, 214th ECS Meeting, Abstract #246, Oct. 2008. 1 page.*

(Continued)

*Primary Examiner* — Earl N Taylor
(74) *Attorney, Agent, or Firm* — Maschoff Brennan

(57) ABSTRACT

A semiconductor device includes a plurality of redistribution layers, a dielectric layer, and a conductive structure. The redistribution layers are formed overlying a device die to provide an electrical connection between the device die and an external connector in a package. The dielectric layer is arranged between the redistribution layers to form a capacitor structure. The conductive structure is formed and coupled between the device die and the redistribution layers.

20 Claims, 18 Drawing Sheets

Related U.S. Application Data is a continuation-in-part of application No. 14/600,777, filed on Jan. 20, 2015, now Pat. No. 9,343,237, which is a continuation-in-part of application No. 14/337,530, filed on Jul. 22, 2014, now Pat. No. 9,006,061, which is a division of application No. 12/825,605, filed on Jun. 29, 2010, now Pat. No. 8,810,002.

(60) Provisional application No. 61/259,787, filed on Nov. 10, 2009.

(51) Int. Cl.
  *H01L 23/00* (2006.01)
  *H01L 49/02* (2006.01)
  *H01L 23/522* (2006.01)
  *H01L 27/08* (2006.01)
  *H01L 21/56* (2006.01)

(52) U.S. Cl.
  CPC .............. *H01L 24/20* (2013.01); *H01L 28/60* (2013.01); *H01L 21/568* (2013.01); *H01L 23/49816* (2013.01); *H01L 23/49827* (2013.01); *H01L 23/5223* (2013.01); *H01L 24/32* (2013.01); *H01L 24/73* (2013.01); *H01L 24/83* (2013.01); *H01L 24/92* (2013.01); *H01L 27/0805* (2013.01); *H01L 28/90* (2013.01); *H01L 2224/04105* (2013.01); *H01L 2224/12105* (2013.01); *H01L 2224/19* (2013.01); *H01L 2224/24195* (2013.01); *H01L 2224/2919* (2013.01); *H01L 2224/32225* (2013.01); *H01L 2224/32245* (2013.01); *H01L 2224/73267* (2013.01); *H01L 2224/92244* (2013.01); *H01L 2224/94* (2013.01); *H01L 2924/19041* (2013.01); *H01L 2924/19105* (2013.01)

(58) Field of Classification Search
  CPC ........ H01L 28/60; H01G 4/005; H01G 4/306; H01G 4/38
  See application file for complete search history.

(56) References Cited

U.S. PATENT DOCUMENTS

| | | | | |
|---|---|---|---|---|
| 5,841,193 A * | | 11/1998 | Eichelberger | H01L 23/5389 257/723 |
| 6,212,057 B1 * | | 4/2001 | Kohara | H01G 4/08 361/301.4 |
| 6,297,524 B1 | | 10/2001 | Vathulya et al. | |
| 6,329,234 B1 | | 12/2001 | Ma et al. | |
| 6,410,954 B1 | | 6/2002 | Sowlati et al. | |
| 6,441,419 B1 | | 8/2002 | Johnson et al. | |
| 6,524,940 B2 | | 2/2003 | Verhaverbeke et al. | |
| 6,570,210 B1 | | 5/2003 | Sowlati et al. | |
| 6,635,916 B2 | | 10/2003 | Aton | |
| 6,740,922 B2 | | 5/2004 | Jones et al. | |
| 6,743,671 B2 | | 6/2004 | Hu et al. | |
| 6,746,914 B2 | | 6/2004 | Kai et al. | |
| 6,822,312 B2 | | 11/2004 | Sowlati et al. | |
| 6,897,505 B2 | | 5/2005 | Aton | |
| 6,897,544 B2 * | | 5/2005 | Ooi | H01G 4/224 257/296 |
| 6,974,994 B1 | | 12/2005 | Kuo et al. | |
| 7,180,160 B2 | | 2/2007 | Ferrant et al. | |
| 7,187,015 B2 | | 3/2007 | Tsau | |
| 7,298,001 B1 | | 11/2007 | Liu et al. | |
| 7,348,624 B2 | | 3/2008 | Sakaguchi et al. | |
| 7,385,241 B2 | | 6/2008 | Choi | |
| 7,446,390 B2 | | 11/2008 | Okuda et al. | |
| 7,466,534 B2 | | 12/2008 | Chinthakindi | |
| 7,485,912 B2 | | 2/2009 | Wang | |
| 7,485,914 B2 | | 2/2009 | Huang et al. | |
| 7,518,850 B2 | | 4/2009 | Kim et al. | |
| 7,551,421 B2 | | 6/2009 | Thompson et al. | |
| 7,579,643 B2 | | 8/2009 | Oh et al. | |
| 7,635,887 B2 | | 12/2009 | Steltenpohl | |
| 7,643,268 B2 | | 1/2010 | Chinthakindi | |
| 7,662,695 B2 | | 2/2010 | Choi | |
| 7,663,175 B2 | | 2/2010 | Komura et al. | |
| 7,667,256 B2 | | 2/2010 | Hommel et al. | |
| 7,714,371 B2 | | 5/2010 | Paul et al. | |
| 7,741,670 B2 | | 6/2010 | Pan | |
| 7,755,164 B1 * | | 7/2010 | Rinne | H01L 27/016 257/531 |
| 7,768,054 B2 | | 8/2010 | Benetik et al. | |
| 7,768,055 B2 | | 8/2010 | Chinthakindi et al. | |
| 7,859,825 B2 | | 12/2010 | Kim et al. | |
| 7,863,662 B2 | | 1/2011 | Sato et al. | |
| 7,866,015 B2 | | 1/2011 | Chinthakindi | |
| 7,958,626 B1 * | | 6/2011 | Karim | H01L 21/4846 29/825 |
| 8,130,507 B2 * | | 3/2012 | Origuchi | H01L 23/49838 174/260 |
| 8,134,195 B2 | | 3/2012 | Lee et al. | |
| 8,138,539 B2 | | 3/2012 | Barth et al. | |
| 8,169,014 B2 | | 5/2012 | Chen et al. | |
| 8,207,567 B2 | | 6/2012 | Chin et al. | |
| 8,258,600 B2 | | 9/2012 | Sugisaki et al. | |
| 8,269,337 B2 | | 9/2012 | Hu et al. | |
| 8,810,002 B2 * | | 8/2014 | Jou | H01G 4/005 257/535 |
| 8,836,114 B2 | | 9/2014 | Oh et al. | |
| 9,000,584 B2 | | 4/2015 | Lin et al. | |
| 9,006,888 B2 | | 4/2015 | Shim et al. | |
| 9,048,222 B2 | | 6/2015 | Hung et al. | |
| 9,048,233 B2 | | 6/2015 | Wu et al. | |
| 9,064,874 B2 | | 6/2015 | Edelstein et al. | |
| 9,111,949 B2 | | 8/2015 | Yu et al. | |
| 9,263,511 B2 | | 2/2016 | Yu et al. | |
| 9,281,254 B2 | | 3/2016 | Yu et al. | |
| 9,368,460 B2 | | 6/2016 | Yu et al. | |
| 9,372,206 B2 | | 6/2016 | Wu et al. | |
| 9,461,106 B1 * | | 10/2016 | Yang | H01L 28/60 |
| 9,490,203 B2 * | | 11/2016 | Tsai | H01L 23/48 |
| 9,496,189 B2 | | 11/2016 | Yu et al. | |
| 9,558,965 B2 | | 1/2017 | Chi et al. | |
| 9,624,094 B1 * | | 4/2017 | Sun | B81B 7/007 |
| 9,673,173 B1 * | | 6/2017 | Li | H01L 25/0655 |
| 9,768,037 B2 * | | 9/2017 | Palm | H01L 23/538 |
| 9,818,659 B2 * | | 11/2017 | Bishop | H01L 23/5389 |
| 9,824,989 B2 * | | 11/2017 | Shih | H01L 23/3128 |
| 9,941,239 B2 * | | 4/2018 | Chang | H05F 3/02 |
| 2001/0017758 A1 * | | 8/2001 | Saito | H01G 4/18 361/524 |
| 2002/0020898 A1 * | | 2/2002 | Vu | H01L 21/56 257/676 |
| 2002/0047154 A1 | | 4/2002 | Sowlati et al. | |
| 2003/0211731 A1 | | 11/2003 | Kai et al. | |
| 2004/0138050 A1 | | 7/2004 | Wang et al. | |
| 2004/0164339 A1 | | 8/2004 | Felsner et al. | |
| 2005/0087356 A1 * | | 4/2005 | Forcier | B81C 1/0023 174/558 |
| 2005/0087850 A1 * | | 4/2005 | Nishikawa | H01L 23/50 257/678 |
| 2005/0133848 A1 | | 6/2005 | Rotella | |
| 2006/0044734 A1 * | | 3/2006 | Ahn | H01G 4/1209 361/313 |
| 2006/0086965 A1 | | 4/2006 | Sakaguchi et al. | |
| 2006/0220167 A1 * | | 10/2006 | Min | H01L 21/4857 257/499 |
| 2007/0025092 A1 * | | 2/2007 | Lee | H01L 23/49822 361/761 |
| 2007/0071052 A1 | | 3/2007 | Hommel et al. | |
| 2007/0076391 A1 * | | 4/2007 | Hsu | H01L 23/5389 361/763 |
| 2007/0079986 A1 * | | 4/2007 | Kikuchi | H01L 21/6835 174/260 |

(56) References Cited

U.S. PATENT DOCUMENTS

| | | | |
|---|---|---|---|
| 2007/0176175 A1* | 8/2007 | Shioga | H01G 4/228 257/40 |
| 2008/0030965 A1* | 2/2008 | Lien | H05K 1/162 361/748 |
| 2008/0197399 A1 | 8/2008 | Hsu et al. | |
| 2008/0237828 A1 | 10/2008 | Yang | |
| 2009/0141424 A1 | 6/2009 | Barth et al. | |
| 2009/0237900 A1* | 9/2009 | Origuchi | H01L 23/49838 361/763 |
| 2010/0012989 A1 | 1/2010 | Lee et al. | |
| 2010/0054022 A1* | 3/2010 | Beck | G11C 7/1006 365/149 |
| 2011/0108950 A1* | 5/2011 | Jou | H01G 4/005 257/532 |
| 2011/0124173 A1* | 5/2011 | Kim | H01L 27/10873 438/305 |
| 2011/0186978 A1* | 8/2011 | Kim | H01L 27/0805 257/686 |
| 2011/0267739 A1* | 11/2011 | Yeager | C08G 73/10 361/323 |
| 2012/0112314 A1* | 5/2012 | Jou | H01L 23/5223 257/532 |
| 2012/0269962 A1* | 10/2012 | Blomberg | C23C 16/34 427/126.3 |
| 2013/0307119 A1* | 11/2013 | Chen | H01L 23/49822 257/532 |
| 2014/0084391 A1* | 3/2014 | Lenive | H01L 24/24 257/414 |
| 2014/0138845 A1* | 5/2014 | Kulkarni | H01L 23/49822 257/774 |
| 2014/0183693 A1* | 7/2014 | Tsai | H01L 23/48 257/532 |
| 2014/0252597 A1* | 9/2014 | Tsai | H01L 23/3171 257/737 |
| 2014/0252608 A1* | 9/2014 | Chen | H01L 21/4846 257/738 |
| 2015/0349254 A1* | 12/2015 | Chang | H01L 45/1233 257/528 |
| 2016/0005702 A1* | 1/2016 | Shih | H01L 24/82 257/737 |
| 2016/0247757 A1* | 8/2016 | Tsai | H01L 23/48 |
| 2016/0260684 A1* | 9/2016 | Zhai | H01L 25/0652 |
| 2016/0260693 A1* | 9/2016 | Lin | H01L 24/19 |
| 2016/0276173 A1* | 9/2016 | Song | H01L 23/49816 |
| 2016/0276426 A1* | 9/2016 | Yang | H01L 28/60 |
| 2016/0293581 A1* | 10/2016 | Lin | H01L 23/3157 |
| 2016/0372417 A1* | 12/2016 | Weale | H01L 23/5223 |
| 2017/0084596 A1* | 3/2017 | Scanlan | H01L 25/50 |
| 2017/0103927 A1* | 4/2017 | Bishop | H01L 22/20 |
| 2017/0125351 A1* | 5/2017 | Kulkarni | H01L 23/49822 |
| 2017/0141026 A1* | 5/2017 | Tu | H01L 27/0805 |
| 2017/0207147 A1* | 7/2017 | Liao | H01L 23/485 |
| 2017/0278921 A1* | 9/2017 | Chen | H01L 28/60 |
| 2018/0012881 A1* | 1/2018 | Scanlan | H01L 25/50 |
| 2018/0108606 A1* | 4/2018 | Scanlan | H01L 23/49838 |

FOREIGN PATENT DOCUMENTS

| | | |
|---|---|---|
| TW | 201140792 A | 11/2011 |
| TW | 201216390 A | 4/2012 |
| TW | 201225762 A | 6/2012 |

OTHER PUBLICATIONS

OA dated Apr. 1, 2012 from corresponding application No. CN 201010546188.1.

Wang, "Chemical Vapor Deposition of Thin Films for ULSI Interconnect Metallization, Disertation," http://etd.lsu.edu/docs/available/edt-04042005-171306/unrestricted/Wang_dis.pdf, May 2005.

W.S. Liao al et, "A manufacturable interposer MIM decoupling capacitor with robust thin high-K dielectric for heterogeneous 3D IC CoWoS wafer level system integration", 2014, IEEE.

* cited by examiner

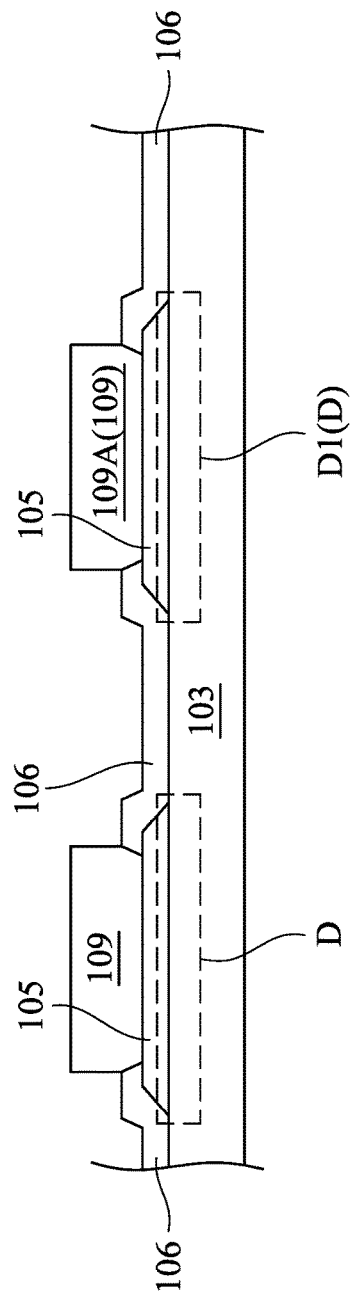
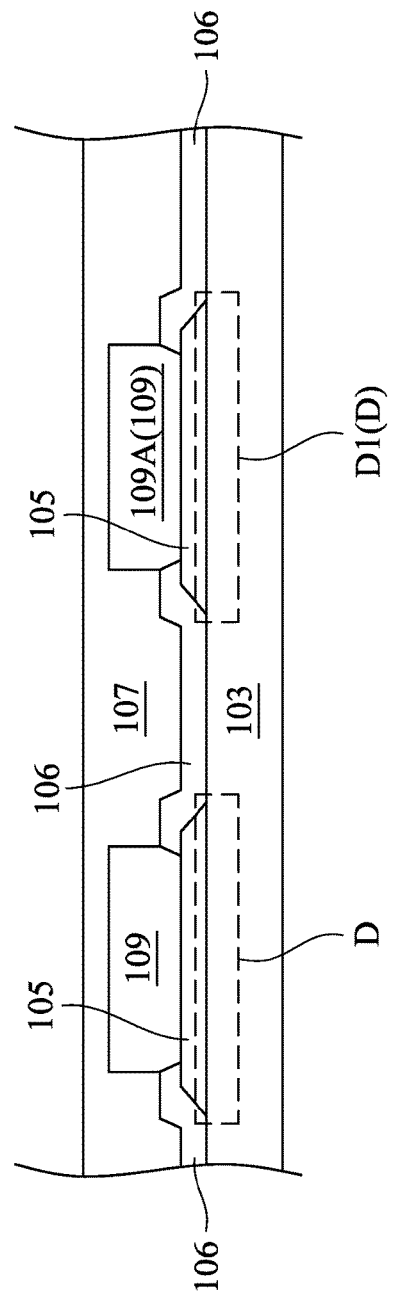

CHIP PACKAGE HAVING INTEGRATED CAPACITOR

RELATED APPLICATIONS

This application is a continuation-in-part of U.S. application Ser. No. 14/996,070 filed on Jan. 14, 2016, which is a continuation-in-part of U.S. application Ser. No. 14/600,777 filed on Jan. 20, 2015, which is a continuation-in-part of U.S. application Ser. No. 14/337,530, filed on Jul. 22, 2014, which is a division and claims priority of U.S. application Ser. No. 12/825,605, filed on Jun. 29, 2010, which claims priority of U.S. Provisional Patent Application No. 61/259,787, filed on Nov. 10, 2009, all of which are incorporated herein by reference.

BACKGROUND

With rapid development of manufacturing process, operation speed of an integrated circuit (IC) has been significantly improved. To reduce impacts from voltage spikes that are introduced with the high operation speed of elements in the integrated circuit, decoupling capacitors are employed to bypass or filter these voltage spikes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-23 are cross sectional views of the semiconductor device in FIG. 1 at different stages of a manufacturing process, in accordance with some embodiments of the present disclosure.

DETAILED DESCRIPTION

Figure 1:
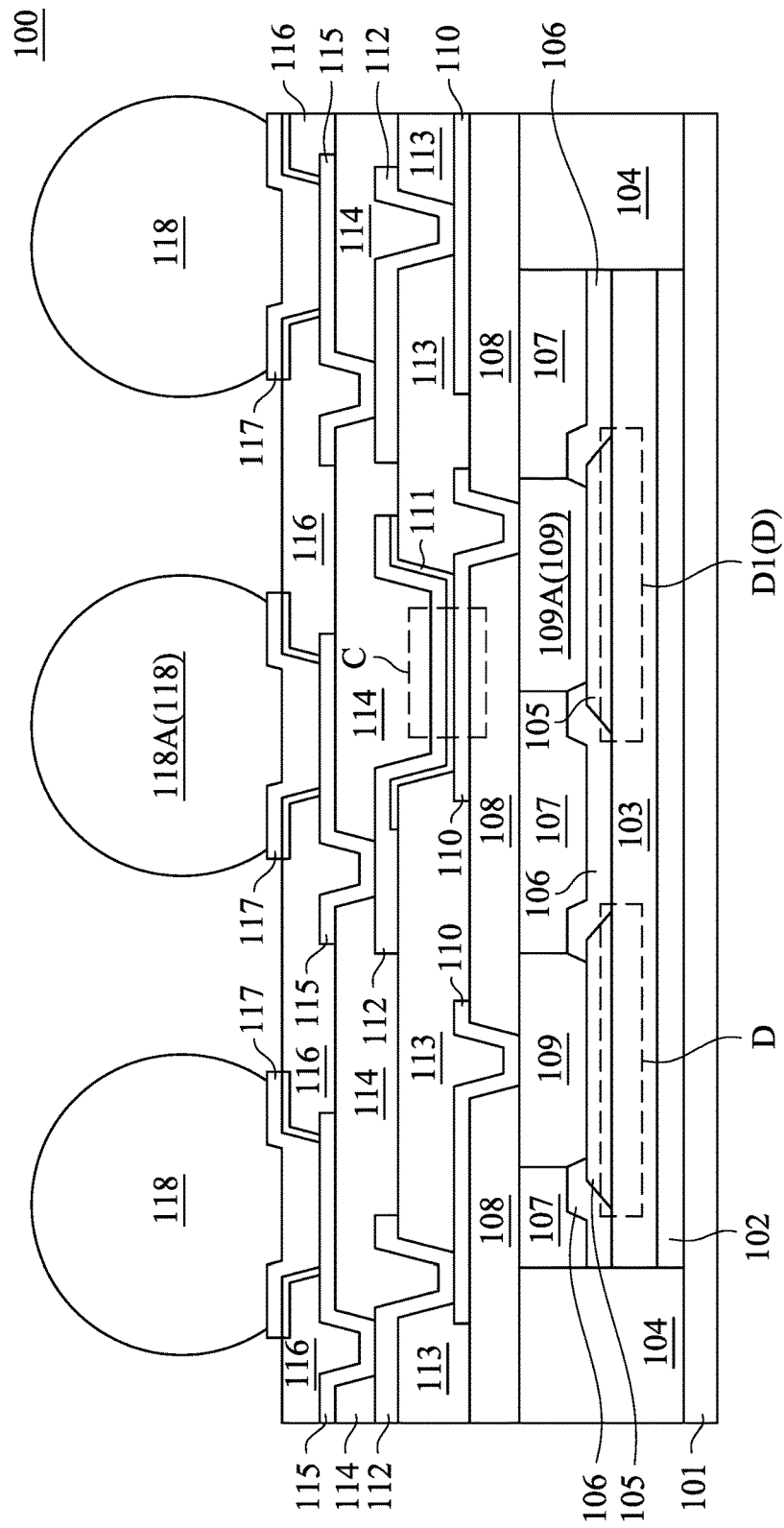
FIG. 1 is a schematic diagram illustrating a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the some embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to some embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

The terms "comprise," "comprising," "include," "including," "has," "having," etc. used in this specification are open-ended and mean "comprises but not limited."

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Reference is now made to FIG. 1. FIG. 1 is a schematic diagram illustrating a semiconductor device 100, in accordance with some embodiments of the present disclosure.

As illustratively shown in FIG. 1, the semiconductor device 100 includes a polymer base layer 101, an adhesive layer 102, a semiconductor layer 103, a molding compound 104, a conductive layer 105, a passivation layer 106, polymer layers 107, 108, 113, 114, and 116, one or more conductive structures 109, redistribution layers (RDLs) 110, 112, and 115, a dielectric layer 111, under bump metallurgies (UBMs) 117, and external connectors 118.

In some embodiments, the dielectric layer 111 is formed between the redistribution layers 110 and 112, so as to form a capacitor structure C. In some embodiments, the capacitor structure C is configured to be as a decoupling capacitor, so as to filter voltage spikes in the semiconductor device 100.

In some embodiments, the redistribution layers 110 and 112 are formed with a metal material. In further embodiments, the capacitor structure C is implemented as a metal-insulator-metal (MiM) capacitor. The redistribution layer 110 is arranged as a capacitor bottom metal (CBM) layer of the MiM capacitor. In addition, the redistribution layer 112 is arranged as a capacitor top metal (CTM) layer of the MiM capacitor. In some embodiments, the metal material includes copper (Cu). The materials of the redistribution layers 110 and 112 are given for illustrative purposes. Various materials to form the redistribution layers 110 and 112 are within the contemplated scope of the present disclosure. In some other embodiments, the metal materials of the redistribution layers 110 and 112 may be different.

In some embodiments, one or more device dies D are formed in the semiconductor layer 103. These device dies D may be various functional circuits that are configured to perform various functions. In some embodiments, the material of the semiconductor layer 103 includes silicon (Si).

In some embodiments, the conductive layer 105 is formed overlying the semiconductor layer 103. The conductive layer 105 is coupled to the device dies D in the semiconductor layer 103. The conductive layer 105 provides electrical connections between the device dies D and other semiconductor elements. Explained in a different way, the device dies D are able to be coupled to other semiconductor elements via the conductive layer 105. In some embodiments, the material of the conductive layer 105 includes aluminum (Al). In some further embodiments, the conductive layer 105 is implemented with one or more Al pads. The materials and the implementations of the conductive layer 105 are given for illustrative purposes. Various materials and the implementations of the conductive layer 105 are within the contemplated scope of the present disclosure.

In some embodiments, the conductive structures 109 are formed overlying the conductive layer 105. The conductive structures 109 are coupled to the conductive layer 105. As described above, the device dies D are coupled to the conductive layer 105. Thus, the device dies D can be coupled to the conductive structures 109 via the conductive layer 105. The material of the conductive structures 109 includes, for example, copper (Cu), titanium (Ti), nickel (Ni), tantalum (Ta), palladium (Pd), silver (Ag), or gold (Au). The materials of the conductive structures 109 are given for illustrative purposes. Various materials of the conductive structures 109 are within the contemplated scope of the present disclosure.

In some embodiments, the redistribution layer 110 is formed overlying one of the conductive structures 109. The redistribution layer 110 is coupled to the conductive structures 109. Thus, the capacitor structure C is coupled to the device die D (for example, the device die D1) via the conductive structure 109 (for example, the conductive structure 109A) and the conductive layer 105. Explained in a different way, in some embodiments, the conductive structure 109A, together with the conductive layer 105, provide electrical connections between the capacitor structure C and the device die D1. Thus, the capacitor structure C is able to receive electrical signals from the device die D1, and to filter noises (for example, voltage spikes) of the electrical signals. For example, the capacitor structure C is coupled to a reference voltage source (not shown), such that noises associated with the device die D1 may be bypassed by the capacitor structure C.

In some embodiments, since the capacitor structure C, the conductive structure 109A, the conductive layer 105, and the device die D1 are integrated in an integrated Fan-Out (InFO) package, additional capacitor elements (for example, discrete capacitors) and wires for connecting the capacitor elements with the device die D1 are omitted. As a result, the cost of the semiconductor device 100 is able to be reduced. In further embodiments, compared with approaches using the discrete capacitors, a substrate configured to form the semiconductor device 100 can be smaller. In addition, since the wires for electrical connections are saved, time delays of signals are shorter. Accordingly, with the arrangements of integrating the capacitor structure C within the InFO package, the size and/or the performance of an electronic device that employs the InFO package are able to be improved.

In this document, the term "coupled" may also be termed as "electrically coupled," and the term "connected" may be termed as "electrically connected." "Coupled" and "connected" may also be used to indicate that two or more elements cooperate or interact with each other.

Figure 2:
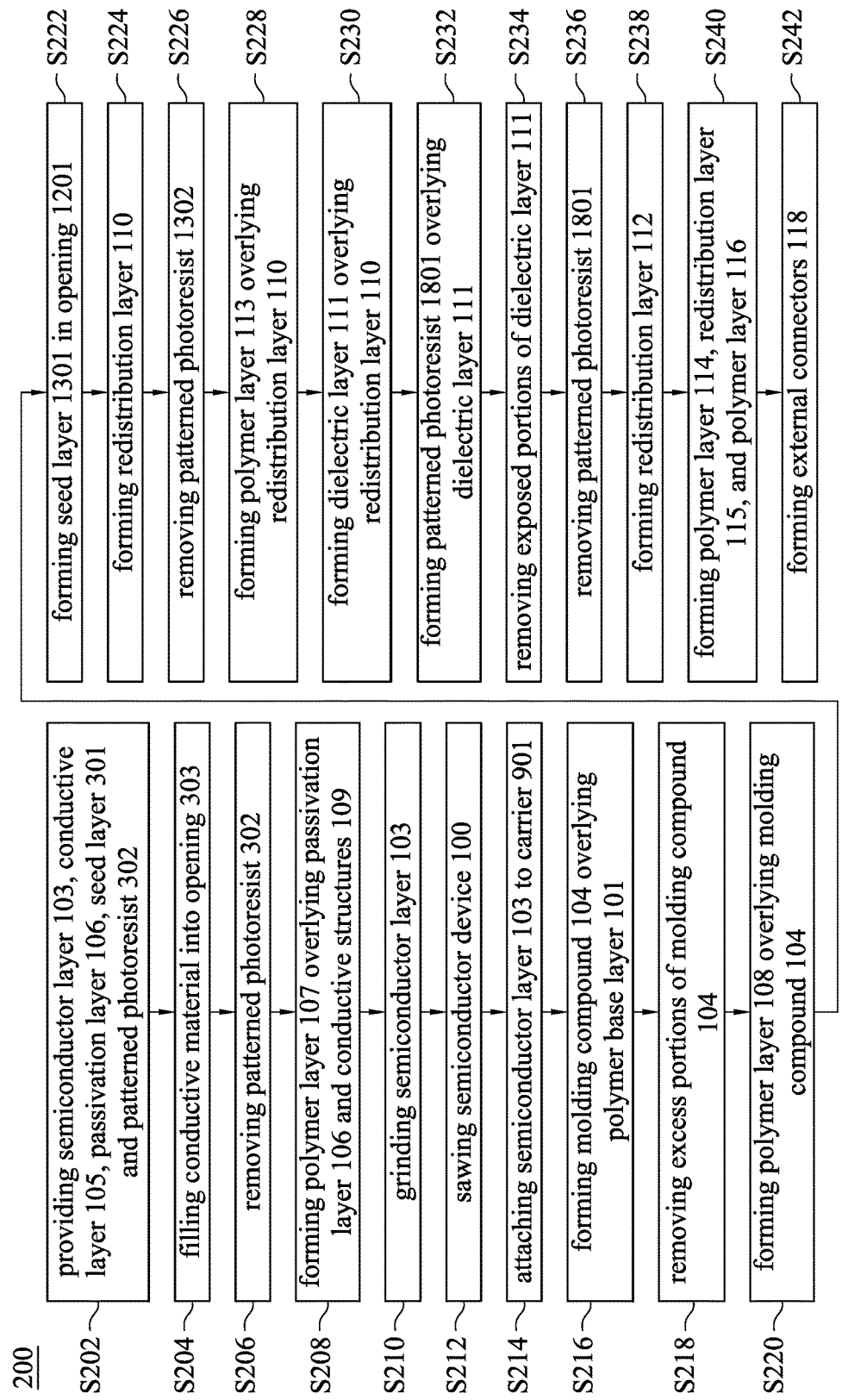
FIG. 2 is a flow chart illustrating a method for fabricating the semiconductor device in FIG. 1, in accordance with some embodiments of the present disclosure.

Reference is now made to FIG. 2. FIG. 2 is a flow chart illustrating a method 200 for fabricating the semiconductor device 100 in FIG. 1, in accordance with some embodiments of the present disclosure. For ease of understanding, the method 200 is discussed in relation to the semiconductor device 100 shown in FIG. 1, but the present disclosure is not limited thereto.

For illustration, the manufacturing process of the semiconductor device 100 in FIG. 1 is described by the method 200 together with FIGS. 3-23. FIGS. 3-23 are cross sectional views of the semiconductor device 100 in FIG. 1 at different stages of a manufacturing process, in accordance with some embodiments of the present disclosure. After the different stages in FIGS. 3-23 are performed, the semiconductor device 100 has the cross sectional view in FIG. 1. Although FIGS. 3-23 are described together with the method 200, it will be appreciated that the structures disclosed in FIGS. 3-23 are not limited to the method 200. For ease of understanding, with respect to the embodiments of FIG. 1, like elements in FIGS. 3-23 are designated with the same reference numbers.

While disclosed methods are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 3:
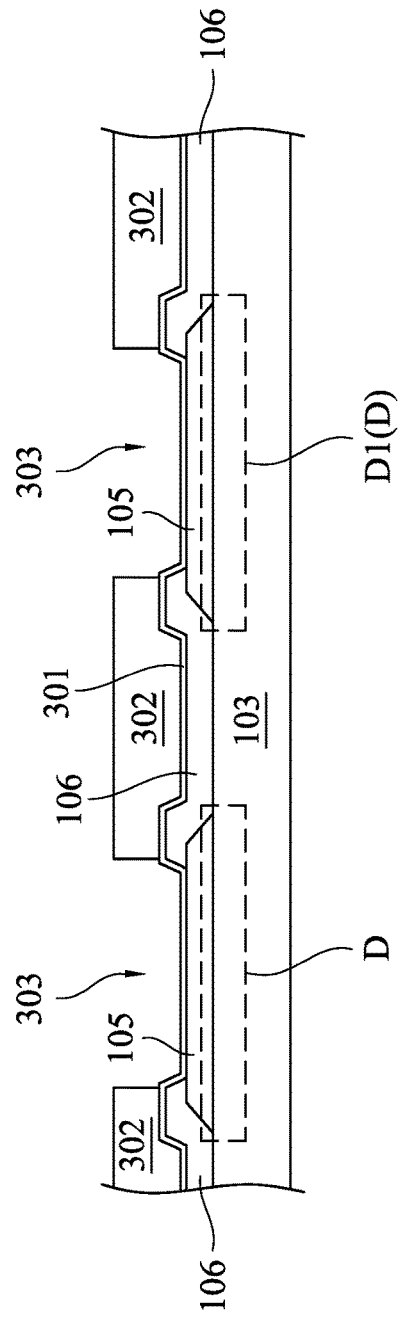

With reference to operation S202 of the method 200, the semiconductor layer 103, the conductive layer 105, the passivation layer 106, a seed layer 301, and a patterned photoresist 302 are provided, as illustratively shown in FIG. 3. In some embodiments, these elements or layers are formed on or in a wafer.

Figure 4:
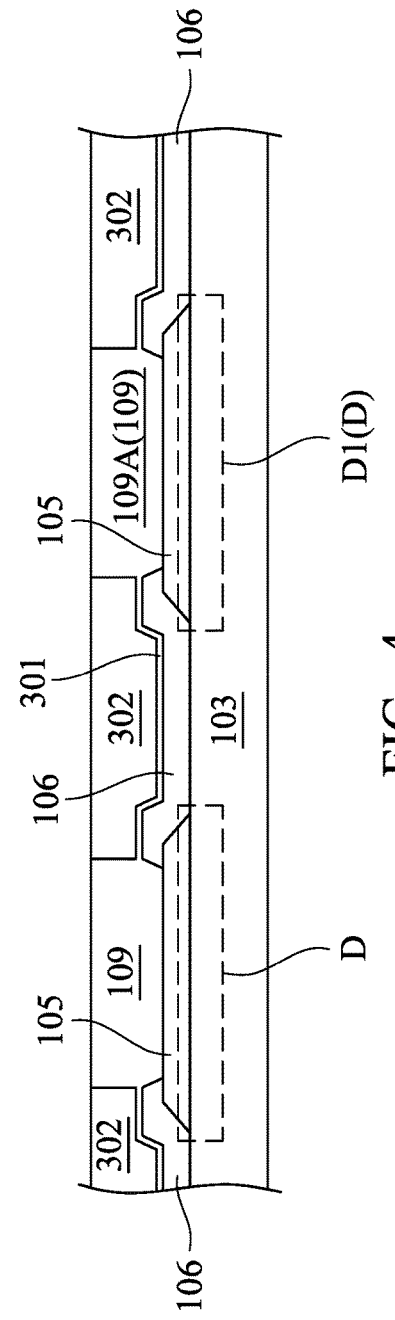

In some embodiments, the conductive layer 105 is formed, by a combination of photolithography and etching processes, overlying the semiconductor layer 103, so as to couple the device dies D. The conductive layer 105 is configured to be as input/output (I/O) pads of the device dies D. In addition, the passivation layer 106 is formed overlying the semiconductor layer 103. The passivation layer 106 is configured to prevent the semiconductor layer 103 from oxidization. In some embodiments, the seed layer 301 is formed overlying the passivation layer 106 and the conductive layer 105. In some embodiments, the material of the seed layer 301 includes TiCu. In some embodiments, a photoresist material is deposited overlying the seed layer 301 and is then patterned, so as to form the patterned photoresist 302. The patterned photoresist 302 is formed to define areas of the conductive structures 109 (as shown in FIG. 4) on the seed layer 301. As illustratively shown in FIG. 3, the patterned photoresist 302 includes openings 303. Positions of the openings 303 are positions of the conductive structures 109. In some embodiments, the openings 303 are aligned with the conductive layer 105. In some embodiments, the openings 303 have a circular shape, a square shape, a rectangular shape, an oval shape, or any other suitable shape.

With reference to operation S204 of the method 200, the openings 303 in FIG. 3 are filled with a conductive material, so as to form the conductive structures 109, as illustratively shown in FIG. 4. In some embodiments, the openings 303 are plated with the conductive material during a plating process. The plating process includes, for example, electrochemically plating, or electroless plating. The conductive material plated in the openings 303 includes, for example, Cu. The aforementioned conductive material is given for illustrative purposes. Various conductive materials are within the contemplated scope of the present disclosure.

With reference to operation S206 of the method 200, the patterned photoresist 302 and the seed layer 301 in FIG. 4 are removed, as illustratively shown in FIG. 5. In some embodiments, the patterned photoresist 302 is removed by a wet strip process. A wet strip solution of the wet strip process includes, for example, Dimethylsufoxide (DMSO) and Tetramethyl ammonium hydroxide (TMAH). In some embodiments, the seed layer 301 under the patterned photoresist 302 is removed by an etching process. The etching process includes, for example, plasma etching.

With reference to operation S208 of the method 200, the polymer layer 107 is formed overlying the passivation layer 106 and the conductive structures 109, as illustratively shown in FIG. 6. In some embodiments, the polymer layer 107 is formed by a combination of a coating process and a curing process. In some embodiments, the polymer layer 107 includes PI, PBO, BCB, epoxy, silicone, acrylates, nano-filled pheno resin, siloxane, a fluorinated polymer, or polynorbornene. The materials of the polymer layer 107 are given for illustrative purposes. Various materials of the polymer layer 107 are within the contemplated scope of the present disclosure.

Figure 7:
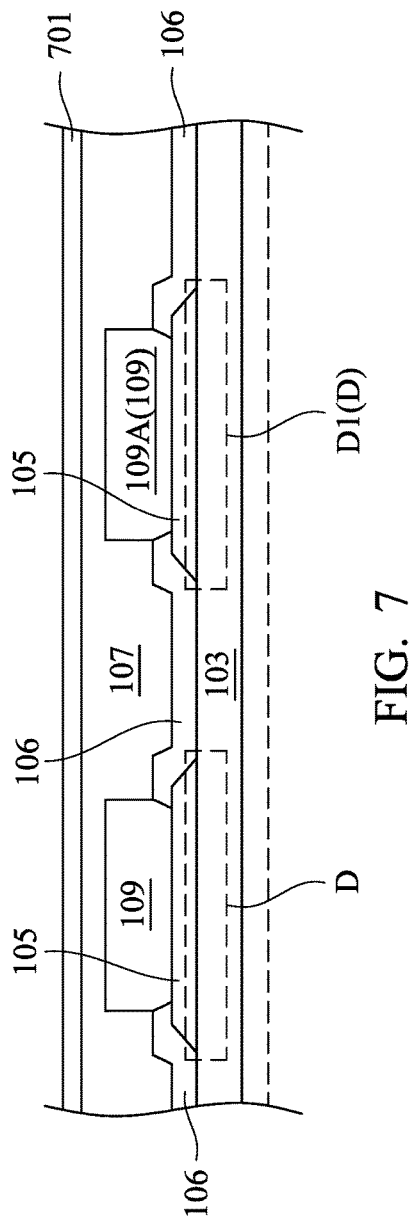

With reference to operation S210 of the method 200, the semiconductor layer 103 is ground, as illustratively shown in FIG. 7. In some embodiments, a grinding tap 701 is attached to the polymer layer 107 when a grinding process is performed to the semiconductor layer 103. The grinding tap 701 is arranged to support to the semiconductor device 100 during the grinding process. In some embodiments, the semiconductor layer 103 is ground by about 250 um, but the present disclosure is not limited thereto.

Figure 8:
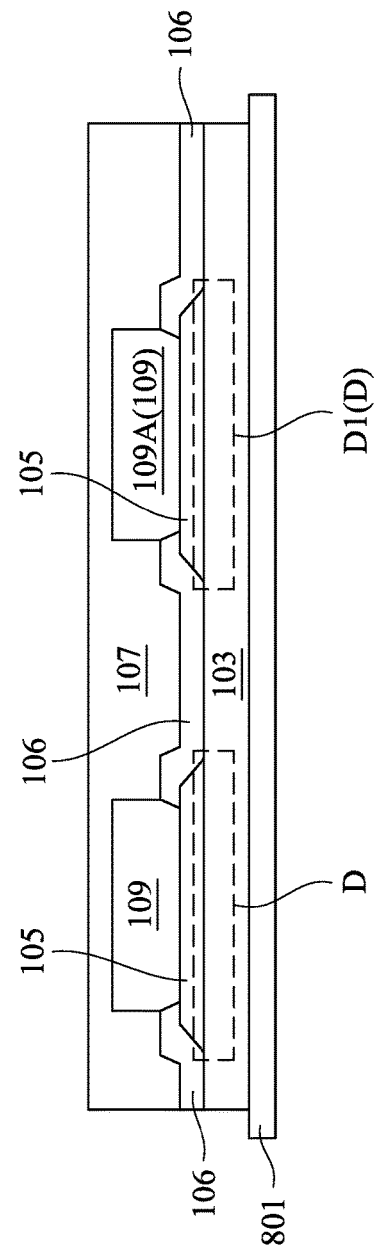

With reference to operation S212 of the method 200, the semiconductor device 100 is sawed, as illustratively shown in FIG. 8. In some embodiments, the semiconductor device 100 is attached to a dicing tape 801 during a sawing process. After the sawing process, the semiconductor device 100 is divided into a plurality of pieces, so as to separate device dies D of the wafer. As an example, FIG. 8 shows one piece of the semiconductor device 100 that includes two device dies D. The number of the device dies D shown in FIG. 8 is given for illustrative purposes. Various numbers of the device dies D on each piece of the semiconductor device 100 are within the contemplated scope of the present disclosure.

Figure 9:
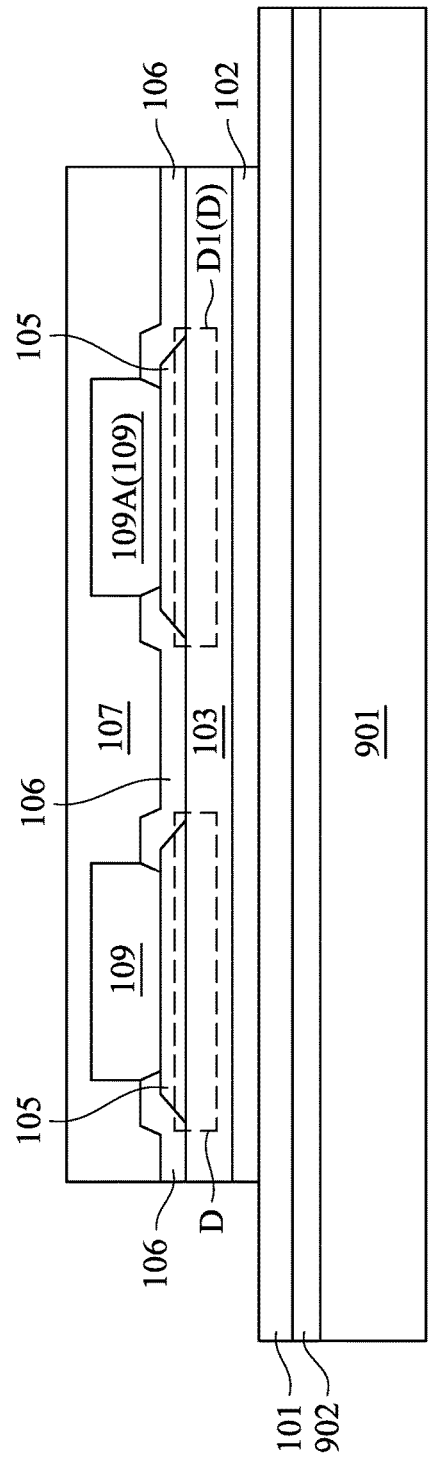
Figure 10:
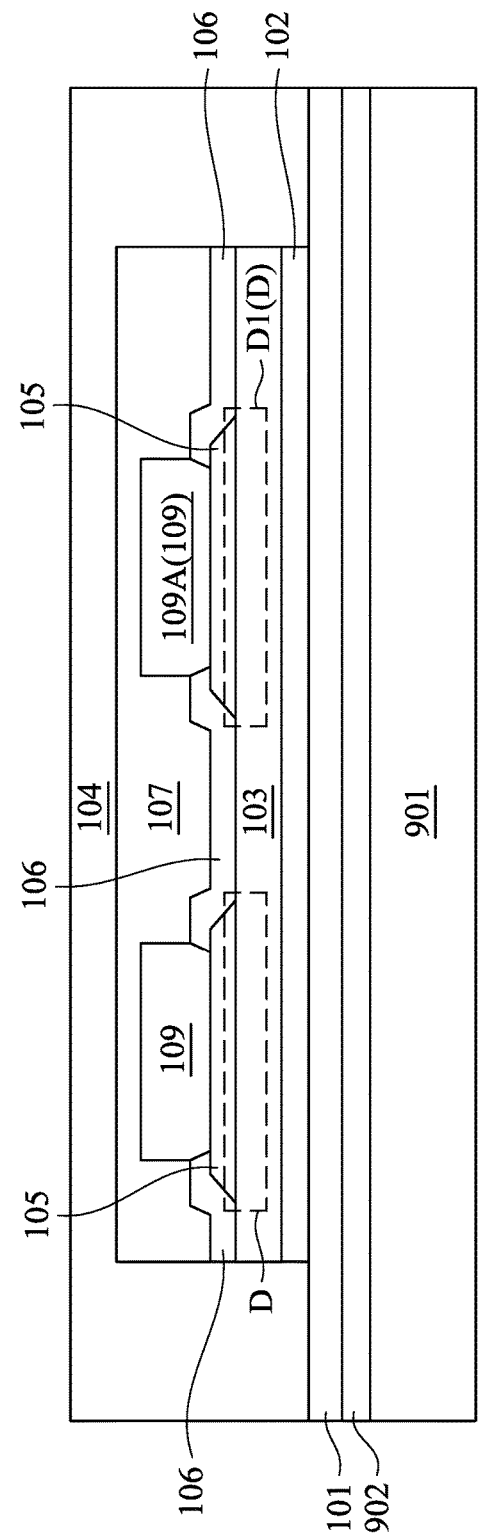
Figure 11:
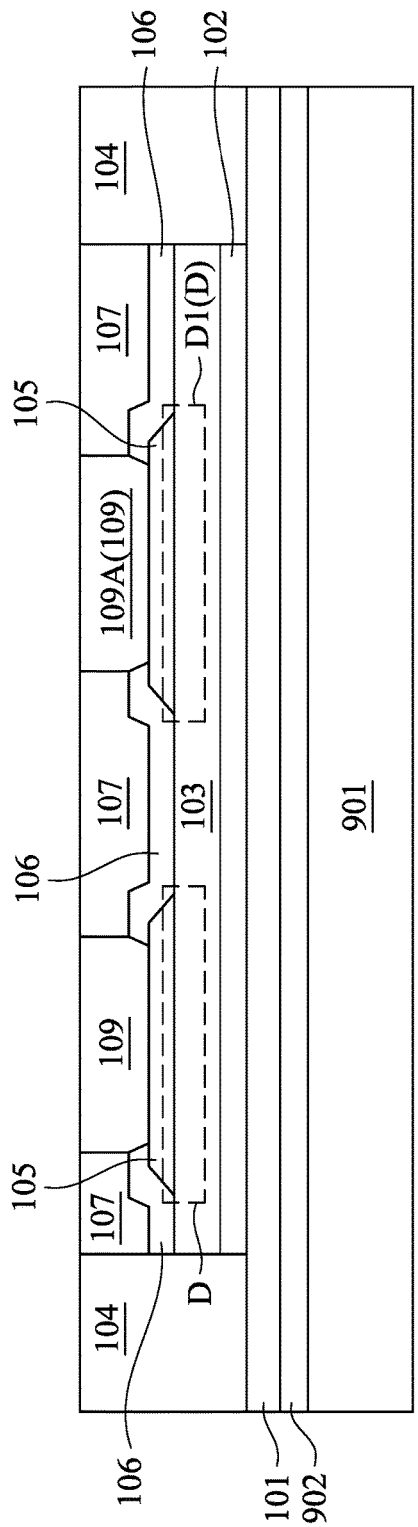

With reference to operation S214 of the method 200, the semiconductor layer 103 is attached to a carrier 901 via the adhesive layer 102, the polymer base layer 101, and an adhesive layer 902, as illustratively shown in FIG. 9. In some embodiments, the adhesive layer 102 is attached to a backside of the semiconductor layer 103. Thus, the semiconductor layer 103 is able to be attached to the polymer base layer 101 via the adhesive layer 102. In some embodiments, the adhesive layer 102 is implemented with a die attach film (DAF). In some embodiments, the polymer base layer 101 is implemented with PolyBenzOxazole (PBO), Ajinomoto Buildup Film (ABF), polyimide, BenzoCycloButene (BCB), or Solder Resist (SR) film. In addition, the polymer base layer 101 is attached to the carrier 901 via the adhesive layer 902. In some embodiments, the adhesive layer 902 is implemented with a glue layer, a light-to-heat conversion (LTHC) film, or an ultraviolet (UV) film. In some embodiments, the carrier 901 is implemented with glass, ceramic, or other suitable material. In some embodiments, the carrier 901 is used to provide structural support during the following formation of various features in the InFO package. In some embodiments, the carrier 901 and the adhesive layer 902 are removed from the InFO package after the packaging process is finished. The implementations of the adhesive layers 102 and 902, the polymer base layer 101, and the carrier 901 are given for illustrative purposes. Various implementations of the adhesive layers 102 and 902, the polymer base layer 101, and the carrier 901 are within the contemplated scope of the present disclosure.

With reference to operation S216 of the method 200, the molding compound 104 is formed overlying the polymer base layer 101. In some embodiments, the molding compound 104 is applied overlying the polymer base layer 101, so as to surround the device dies D, the conductive structures 109, and the polymer layer 107, as illustratively shown in FIG. 10. In some embodiments, the molding compound 104 includes a material that has a relatively high dielectric constant. For example, the material includes high-K polymer or silica. In some embodiments, the molding compound 104 is formed by various suitable methods, which include, for example, compressive molding, transfer molding, and liquid encapsulent molding. For example, the molding compound 104 is dispensed in liquid form. Then, a curing process is performed to solidify the molding compound 104. The operations for forming the molding compound 104 are given for illustrative purposes. Various operations for forming the molding compound 104 are within the contemplated scope of the present disclosure.

With reference to operation S218 of the method 200, excess portions of the molding compound 104 are removed. In some embodiments, a grind process and a chemical mechanical polishing (CMP) process are performed in operation S218 to remove the excess portions of the molding compound 104, so as to expose the conductive structures 109, as illustratively shown in FIG. 11.

Figure 12:
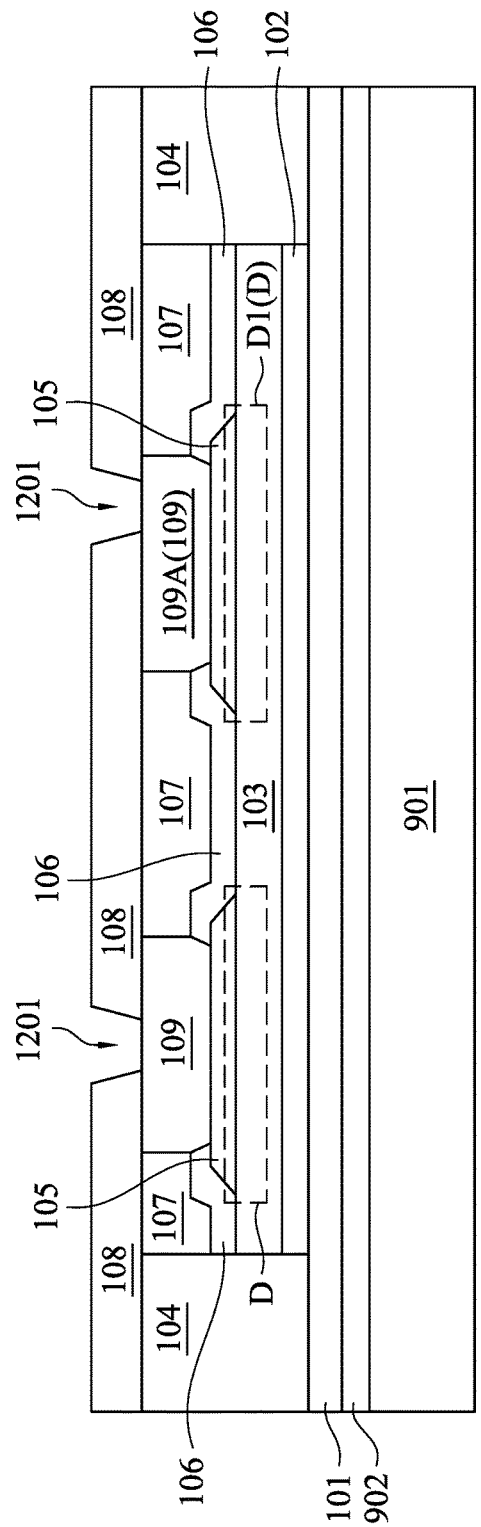

With reference to operation S220 of the method 200, the patterned polymer layer 108 is formed overlying the molding compound 104, as illustratively shown in FIG. 12. In some embodiments, the patterned polymer layer 108 is formed to cover the molding compound 104, the polymer layer 107, and the conductive structures 109. In some embodiments, the polymer layer 108 includes PI, PBO, BCB, epoxy, silicone, acrylates, nano-filled pheno resin, siloxane, a fluorinated polymer, or polynorbornene. In some embodiments, an etchant is empoyled to etch the polymer layer 108, so as to form the openings 1201. The openings 1201 are formed to expose the conductive structures 109. The etchant includes, for example, $CF_4$, $CHF_3$, $C_4F_8$, or HF. The materials of the polymer layer 108 and the etchant are given for illustrative purposes. Various materials of the polymer layer 108 and the etchant are within the contemplated scope of the present disclosure.

Figure 13:
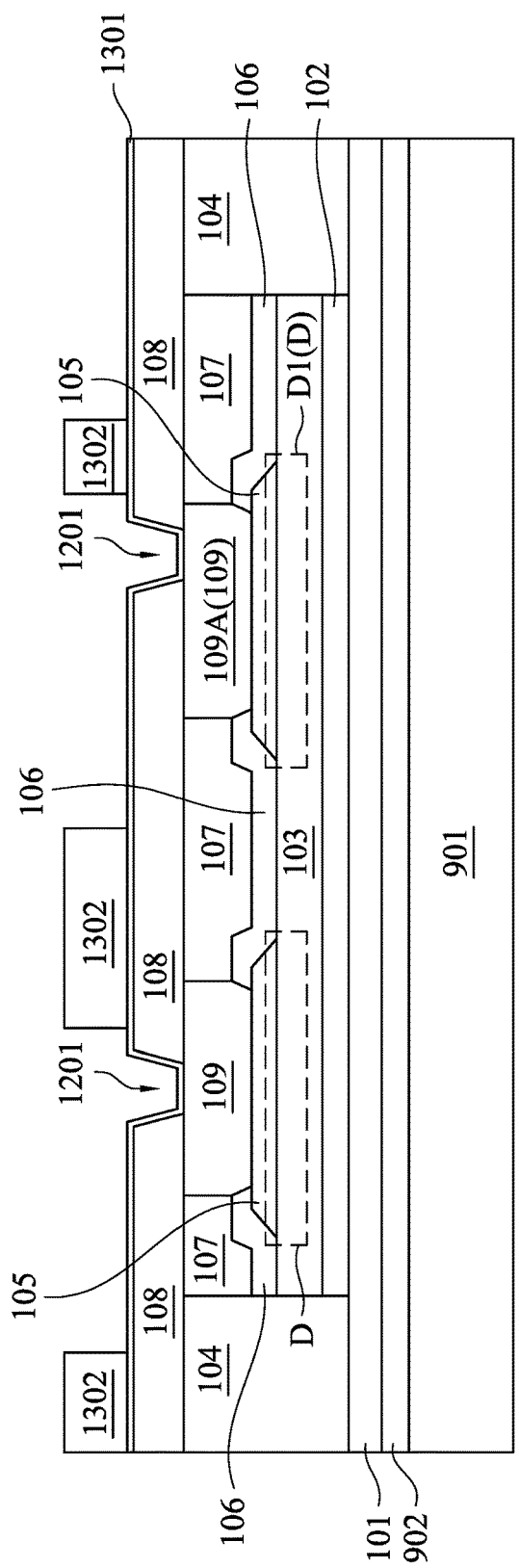

With reference to operation S222 of the method 200, a seed layer 1301 is formed in the opening 1201 and overlying the polymer layer 108, as illustratively shown in FIG. 13. In some embodiments, the seed layer 1301 is formed with conductive materials, which include, for example, TiCu. In some embodiments, the seed layer 1301 is formed to be coupled to the conductive structures 109 via the openings 1201. In addition, a patterned photoresist 1302 is formed overlying the seed layer 1301, in order to cover portions of the seed layer 1301.

Figure 14:
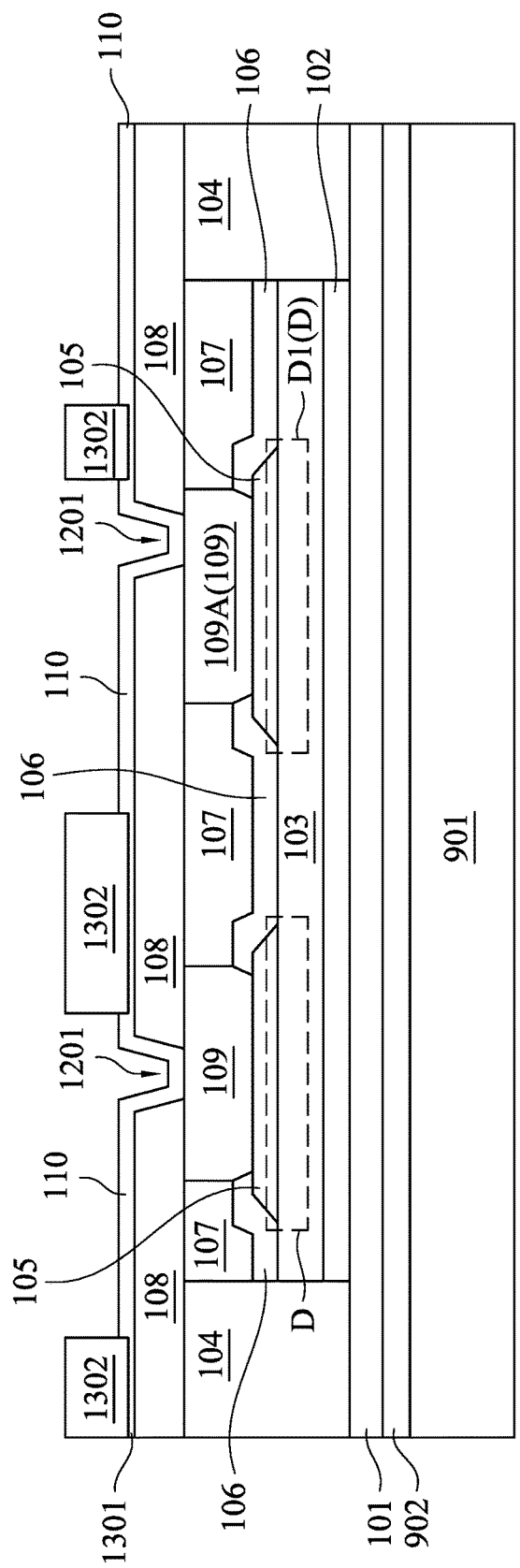

With reference to operation S224 of the method 200, the redistribution layer 110 is formed with respect to the patterned photoresist 1302 in FIG. 13, as illustratively shown in FIG. 14. In some embodiments, the redistribution layer 110 is formed by a plating process. For illustration, a conductive material is plated on exposed portions, which are not covered by the patterned photoresist 1302, of the seed layer 1301 in FIG. 13, in order to form the redistribution layer 110 in FIG. 14. The material of the conductive material is, for example, copper (Cu). In some embodiments, the plating process includes electro-chemically plating or electroless plating.

Figure 15:
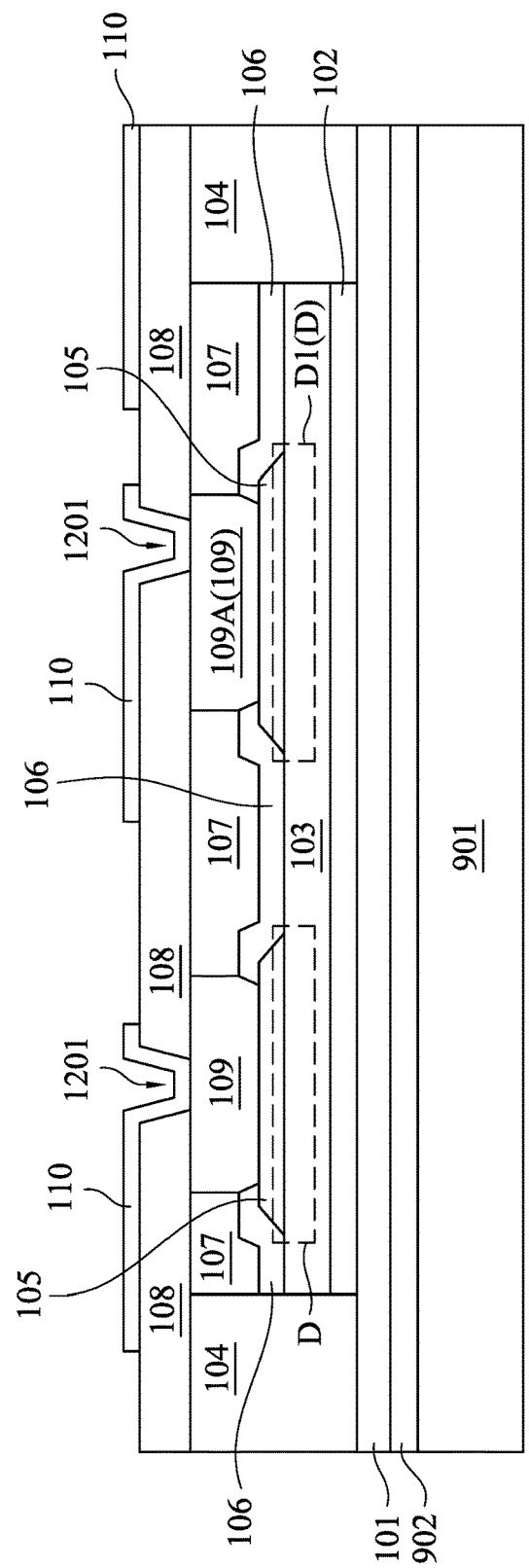

With reference to operation S226 of the method 200, the patterned photoresist 1302 is removed, as illustratively shown in FIG. 15. In some embodiments, portions of the seed layer 1301 under the patterned photoresist 1302 are also removed. Thus, the patterned redistribution layer 110 is formed overlying the polymer layer 108 and in the openings 1201, in order to be arranged as the CBM layer of the capacitor structure C in FIG. 1.

In some embodiments, after the patterned redistribution layer 110 is formed, the polymer layer 108 is arranged between portions of the redistribution layer 110 and portions of the conductive structures 109. The polymer layer 108 is arranged to separate the portions of the redistribution layer 110 and the portions of the conductive structures 109.

Figure 16:
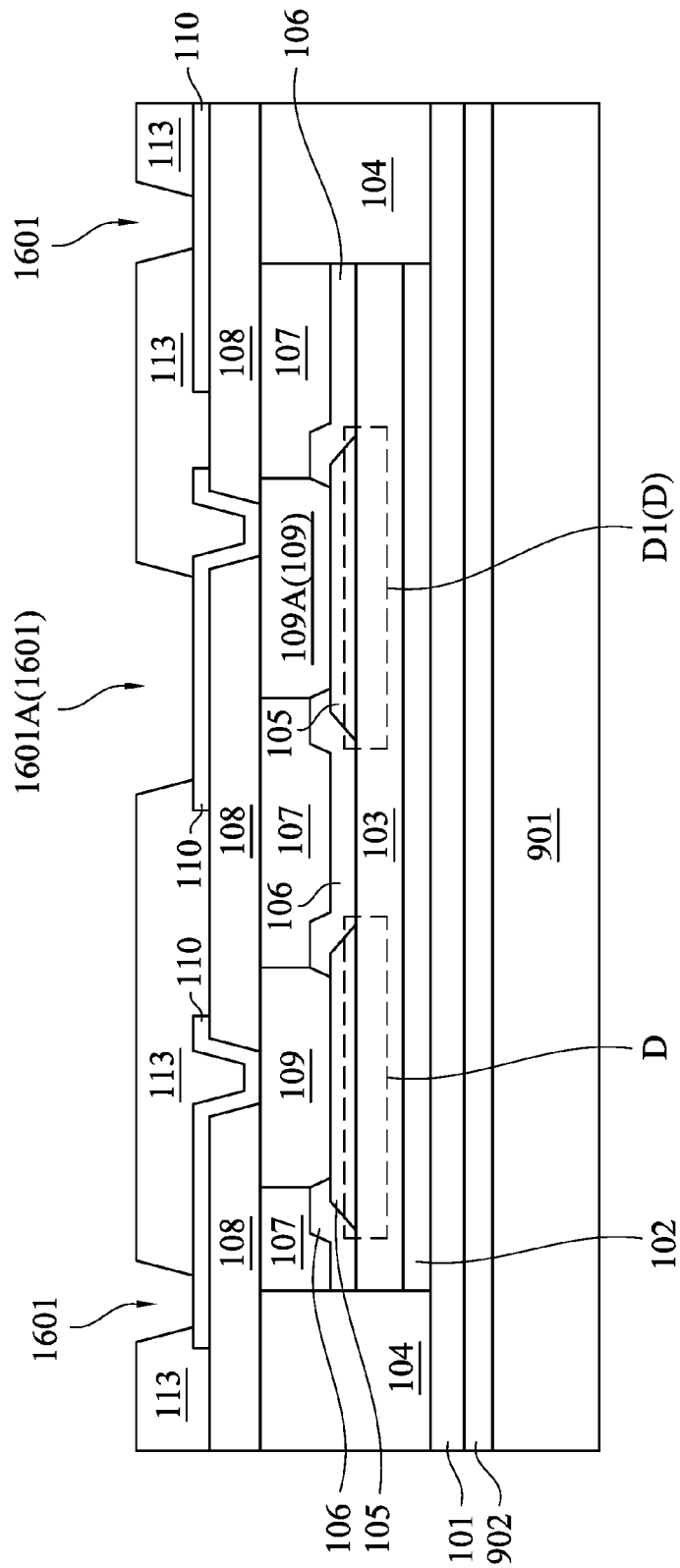

With reference to operation S228 of the method 200, the patterned polymer layer 113 is formed overlying the redistribution layer 110, as illustratively shown in FIG. 16. In some embodiments, the polymer layer 113 includes PI, PBO, BCB, epoxy, silicone, acrylates, nano-filled pheno resin, siloxane, a fluorinated polymer, or polynorbornene. In some embodiments, an etchant is configured to etch the polymer layer 113, so as to form openings 1601. The openings 1601 are formed to expose portions of the redistribution layer 110. In some embodiments, the etchant includes $CF_4$, $CHF_3$, $C_4F_8$, or HF. The materials of the polymer layer 113 and the etchant are given for illustrative purposes. Various materials of the polymer layer 113 and the etchant are within the contemplated scope of the present disclosure.

Figure 17:
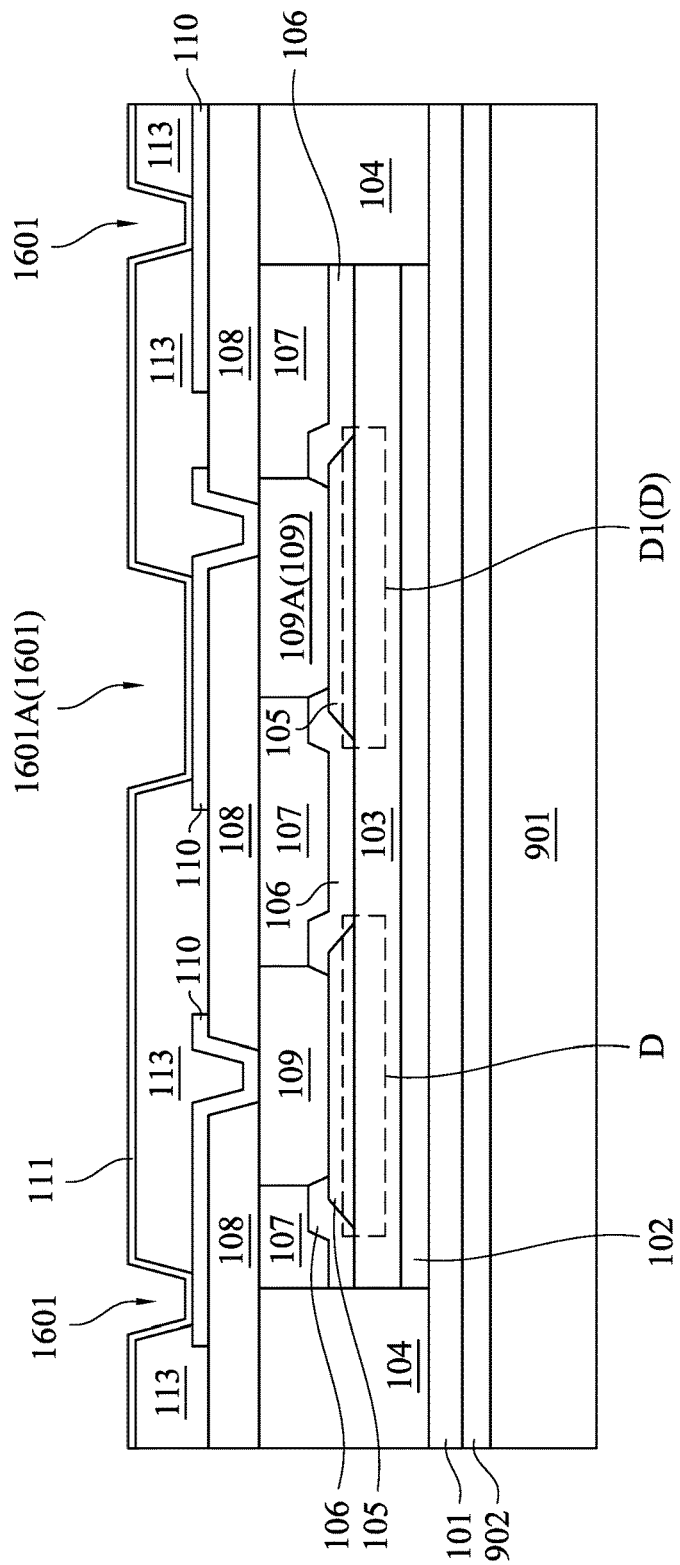

With reference to operation S230 of the method 200, the dielectric layer 111 is formed overlying the redistribution layer 110, as illustratively shown in FIG. 17. In some embodiments, a dielectric material is applied overlying the redistribution layer 110 and the patterned polymer layer 113, so as to form the dielectric layer 111. The dielectric layer 111 is arranged to be an insulating layer of the capacitor structure C in FIG. 1.

In some embodiments, the dielectric material of the dielectric layer 111 includes room-temperature liquid-phase high-K polymer. In some embodiments, the term "room-temperature" indicates a temperature of about 25° C. The room-temperature liquid-phase high-K polymer includes, for example, polyimide (PI), polybenzoxazole (PBO), or a combination thereof. In some embodiments, the dielectric constant (or permittivity) of one of the aforementioned polymers is in a range approximately from 2.8 to 3.

In some other embodiments, the dielectric material of the dielectric layer 111 includes room-temperature or low-temperature liquid-phase $SiO_2$ or Spin on Glass (SOG), of which the dielectric constant is greater than or equal to approximately 4. In some embodiments, the term "low-temperature" associated with the liquid-phase $SiO_2$ or SOG indicates a temperature lower than 250° C. In some other embodiments, the dielectric material of the dielectric layer 111 includes liquid phase SiNx or other high-K dielectric. In some other embodiments, the dielectric material of the dielectric layer 111 includes low-temperature chemical vapor deposited SiNx, $SiO_2$ (CVD-$SiO_2$), SiOxNy, $SrTiO_3$, or a combination thereof deposition. In some embodiments, the term "low-temperature" associated with the chemical vapor deposited SiNx, SiO2 (CVD-SiO2), SiOxNy, or SrTiO3 indicates a temperature lower than 180° C. In some embodiments, the chemical vapor deposition (CVD) includes atmospheric pressure CVD (APCVD), sub-atmospheric CVD (SACVD), plasma enhanced CVD (PECVD), or metal organic CVD (MOCVD).

In some other embodiments, the dielectric material of the dielectric layer 111 includes low-temperature high-K dielectric deposition or other high-K dielectric deposition. In some embodiments, the term "low-temperature" associated with the high-K dielectric deposition indicates a temperate of about 210° C. In some embodiments, the low-temperature high-K dielectric deposition includes $ZrO_2$—$Al2O_3$—$ZrO_2$ (ZAZ). In some other embodiments, the other high-K dielectric deposition includes, $SiO_2$, $Si_3N_4$, $ZrO_2$, $Al_2O_3$, HfOx, HfSiOx, ZrTiOx, TaOx, $TiO_2$, or a combination thereof. In some other embodiments, a structure of the dielectric layer 111 includes atomic layer deposited $SrRuO_3$ (SRO) electrode or $SrTiO_3$ (STO). For example, in some other embodiments, the dielectric material of the dielectric layer 111 includes a $SrRuO_3$—$SrTiO_3$—$SrRuO_3$ (SRO-STO-SRO) structure. In some other embodiments, the other very high-K dielectric deposition includes, $BaSrTiO_3$ (BST), $PbZrTiO_3$ (PZT), $PbZrLaTiO_3$, or a combination thereof. In some embodiments, the dielectric constant of STO, BST, and PZT can be 200, 500, and 1000~1500 respectively.

In some embodiments, the dielectric material of the dielectric layer 111 includes $TiO_2$ which has a dielectric constant greater than 80. For example, the dielectric constant of $TiO_2$ is in a range approximately from 80 to 100.

In some embodiments, the dielectric constant of the dielectric layer 111 is greater than that of the molding compound 104. In some embodiments, the molding compound 104 has a low-k value. In some embodiments, the term "low-k" indicates a dielectric constant lower than 2.5. In some embodiments, the dielectric constant of the dielectric layer 111 is greater than 2.8. In some embodiments, the molding compound 104 includes an epoxy resin or a molding underfill. The materials of the molding compound 104 are given for illustrative purposes. Various materials of the molding compound 104 are within the contemplated scope of the present disclosure.

Figure 18:
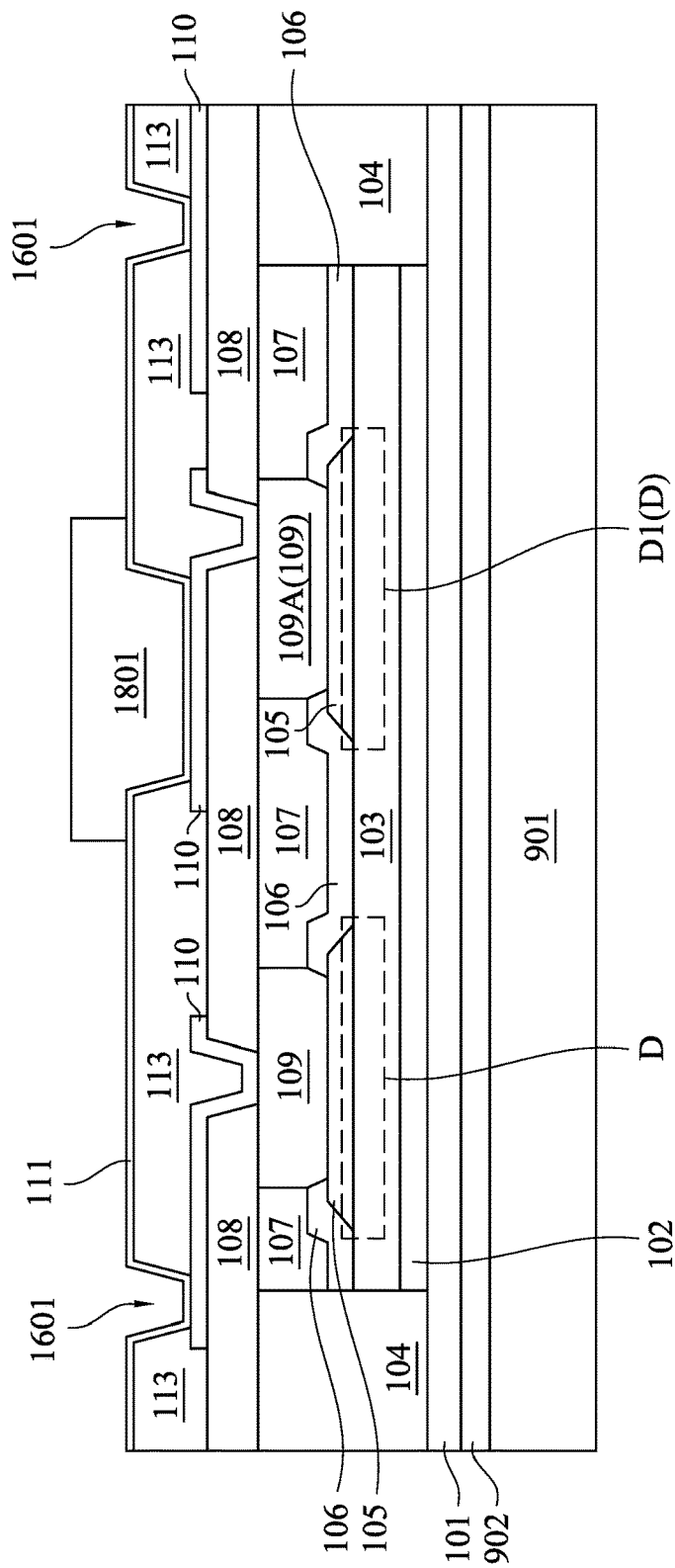

With reference to operation S232 of the method 200, a patterned photoresist 1801 is formed with respect to the opening 1601 (for example, the opening 1601A), as illustratively shown in FIG. 18. In some embodiments, a photoresist layer is formed on the dielectric layer 111 and is exposed using a photo mask (not shown). Exposed or unexposed portions respected to the photoresist layer are removed depending on whether a negative or positive photoresist is used. For example, the patterned photoresist 1801 includes positive photoresist, the exposed portions of the dielectric layer 111 are removed in the following operations. Accordingly, in some embodiments, the patterned photoresist 1801 is arranged to define an area, on the redistribution layer 110, corresponding to the capacitor structure C in FIG. 1. In some embodiments, the patterned photoresist 1801 is formed by using a single photo mask, in order to define the location of the dielectric layer 111 in the capacitor structure C in FIG. 1. Accordingly, in the embodiments of FIG. 18, there is only one extra photo mask is used to define the dielectric layer 111 of the capacitor structure C, additional cost is low.

Figure 19:
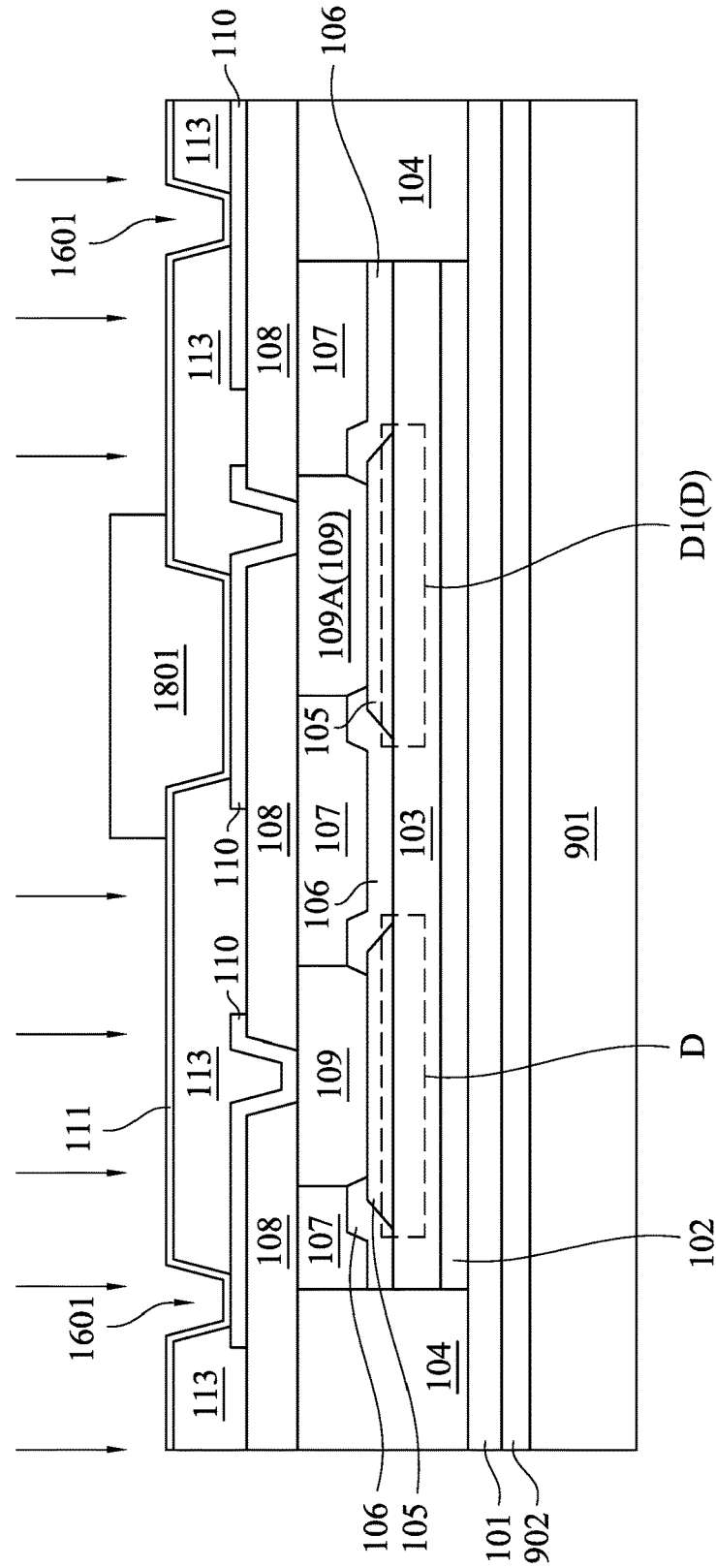

With reference to operation S234 of the method 200, the exposed portions of the dielectric layer 111 are removed, as illustratively shown in FIG. 19. In some embodiments, an etching process is performed in operation S234, to remove the dielectric material outside the area defined by the photoresist 1801. In some embodiments, the etching process includes plasma etching.

Figure 20:
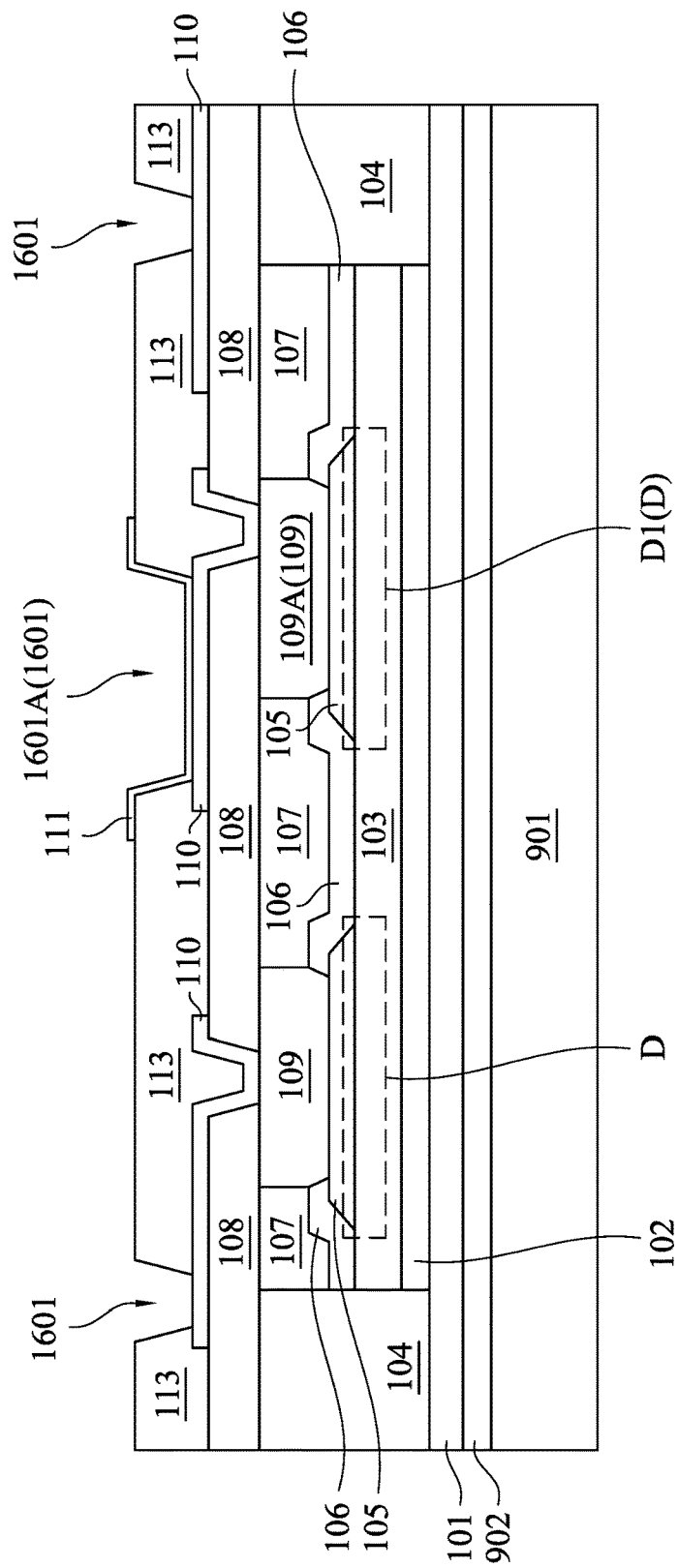

With reference to operation S236 of the method 200, the patterned photoresist 1801 is removed, as illustratively shown in FIG. 20. In some embodiments, a plasma ashing or wet strip process is used to remove the patterned photoresist 1801. In some embodiments, the plasma ashing process is followed by a wet dip in a sulfuric acid ($H_2SO_4$) solution to remove the photoresist material of the patterned photoresist 1801. Thus, the patterned dielectric layer 111 is formed to be the insulating layer of the capacitor structure C in FIG. 1.

Figure 21:
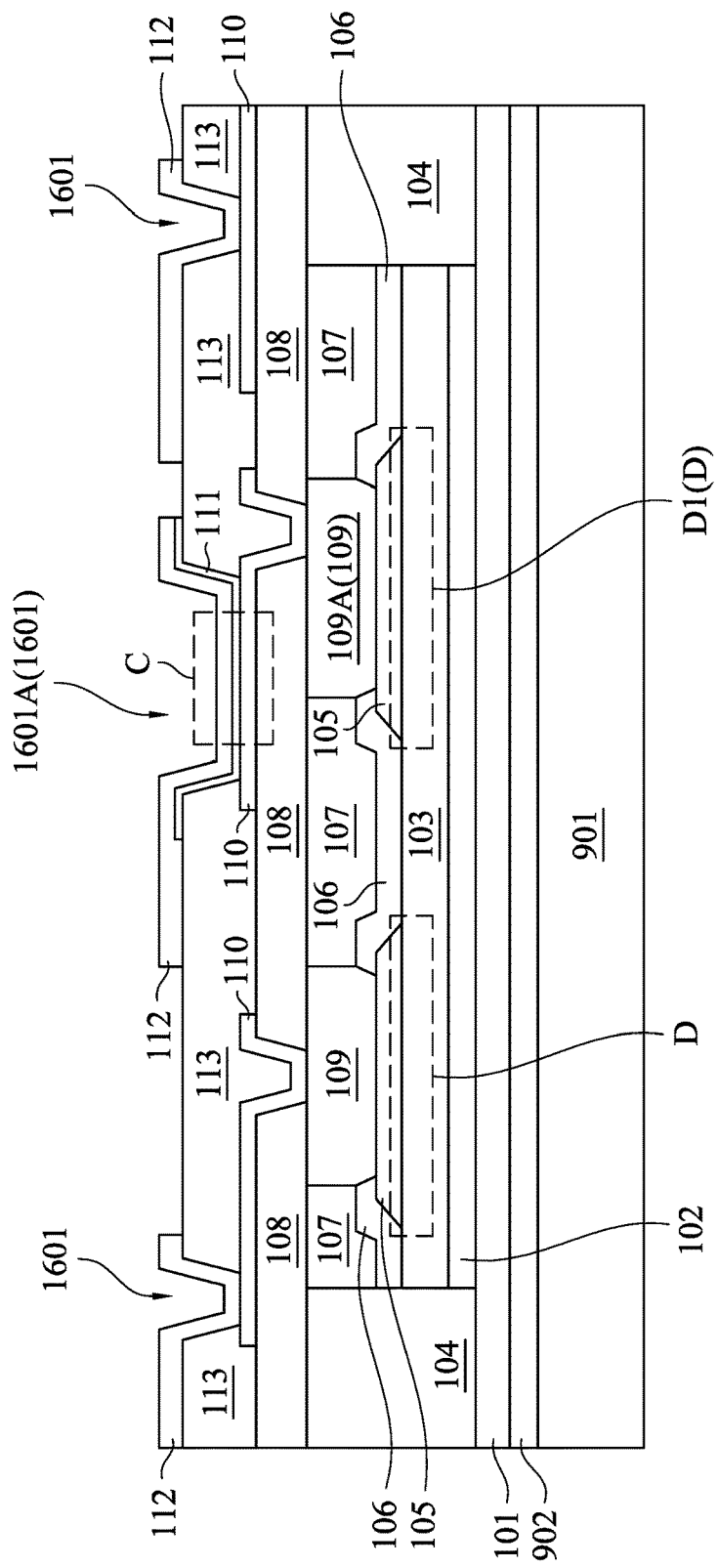
Figure 22:
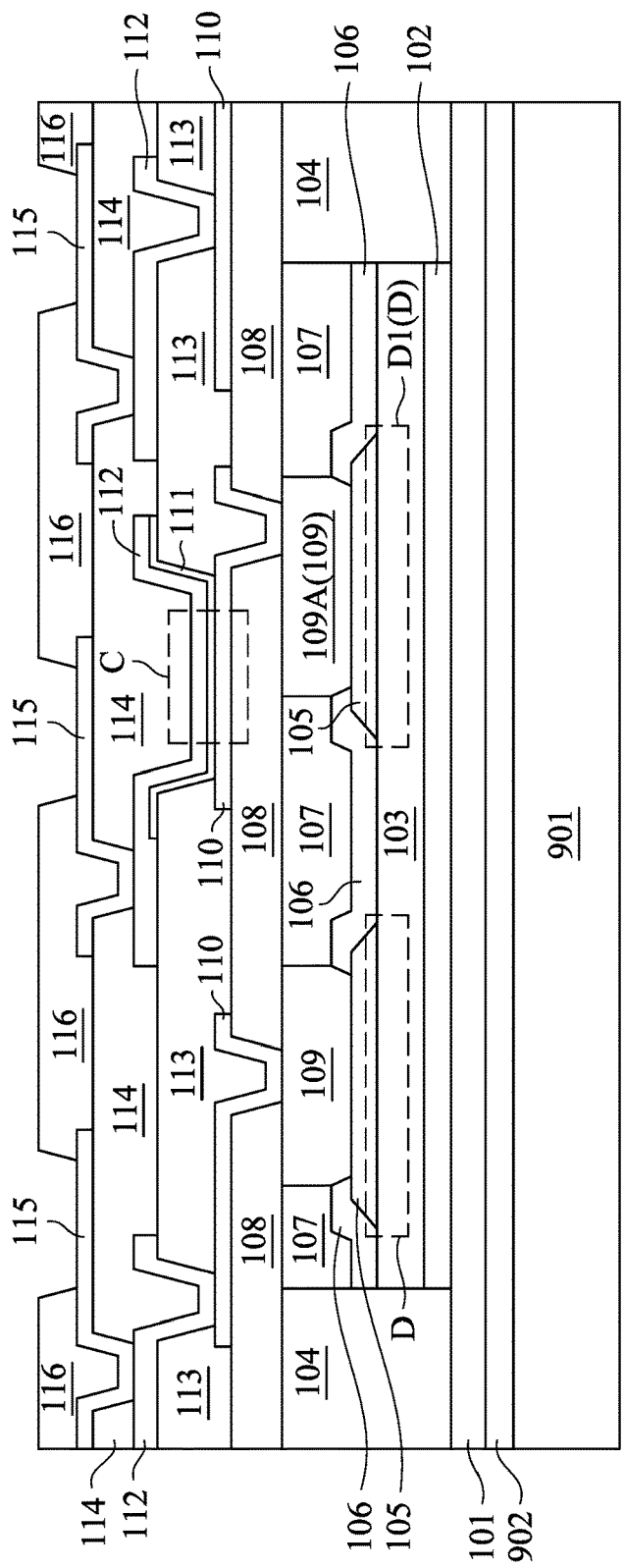

With reference to operation S238 of the method 200, the patterned redistribution layer 112 is formed overlying the dielectric layer 111, as illustratively shown in FIG. 21. With the arrangements of the redistribution layer 110, the dielectric layer 111, and the patterned redistribution layer 112, the capacitor structure C is formed to be coupled to the device die D1 via the conductive structure 109A and the conductive layer 105. In some embodiments, the patterned redistribution layer 112 is arranged as the CTM layer of the capacitor structure C in FIG. 1. In some embodiments, the operations for forming the patterned redistribution layer 112 are similar to the operations for forming the patterned redistribution layer 110, and thus detailed descriptions are not provided herein again.

In some embodiments, after the patterned redistribution layer 112 is formed, the polymer layer 113 is arranged between portions of the redistribution layer 112 and portions of the redistribution layer 110. In some embodiments, the polymer layer 113 is further arranged to separate the portions of the redistribution layer 112 and the portions of the redistribution layer 110.

With reference to operation S240 of the method 200, the patterned polymer layer 114, the patterned redistribution layer 115, and the patterned polymer layer 116 are formed. As illustratively shown in FIG. 22, in some embodiments, the patterned polymer layer 114 is formed overlying the redistribution layer 112 and the polymer layer 113. The patterned redistribution layer 115 is formed overlying the redistribution layer 112 and the polymer layer 114. The redistribution layer 115 is coupled to the redistribution layer 112. In addition, the patterned polymer layer 116 is formed overlying the polymer layer 114 and the redistribution layer 115. In some embodiments, the operations for forming the polymer layers 114 and 116 are similar to that of forming the aforementioned polymer layer 108, and thus detailed descriptions are not further provided herein. In addition, in some embodiments, the operations for forming the redistribution layer 115 are similar to the operations for forming the aforementioned redistribution layer 110, and thus detailed descriptions are not further provided herein.

In some embodiments, after the patterned redistribution layer 115 is formed, the polymer layer 114 is arranged between portions of the redistribution layer 115 and portions of the redistribution layer 112. In some embodiments, the polymer layer 114 is further arranged to separate the portions of the redistribution layer 115 and the portions of the redistribution layer 112.

Figure 23:
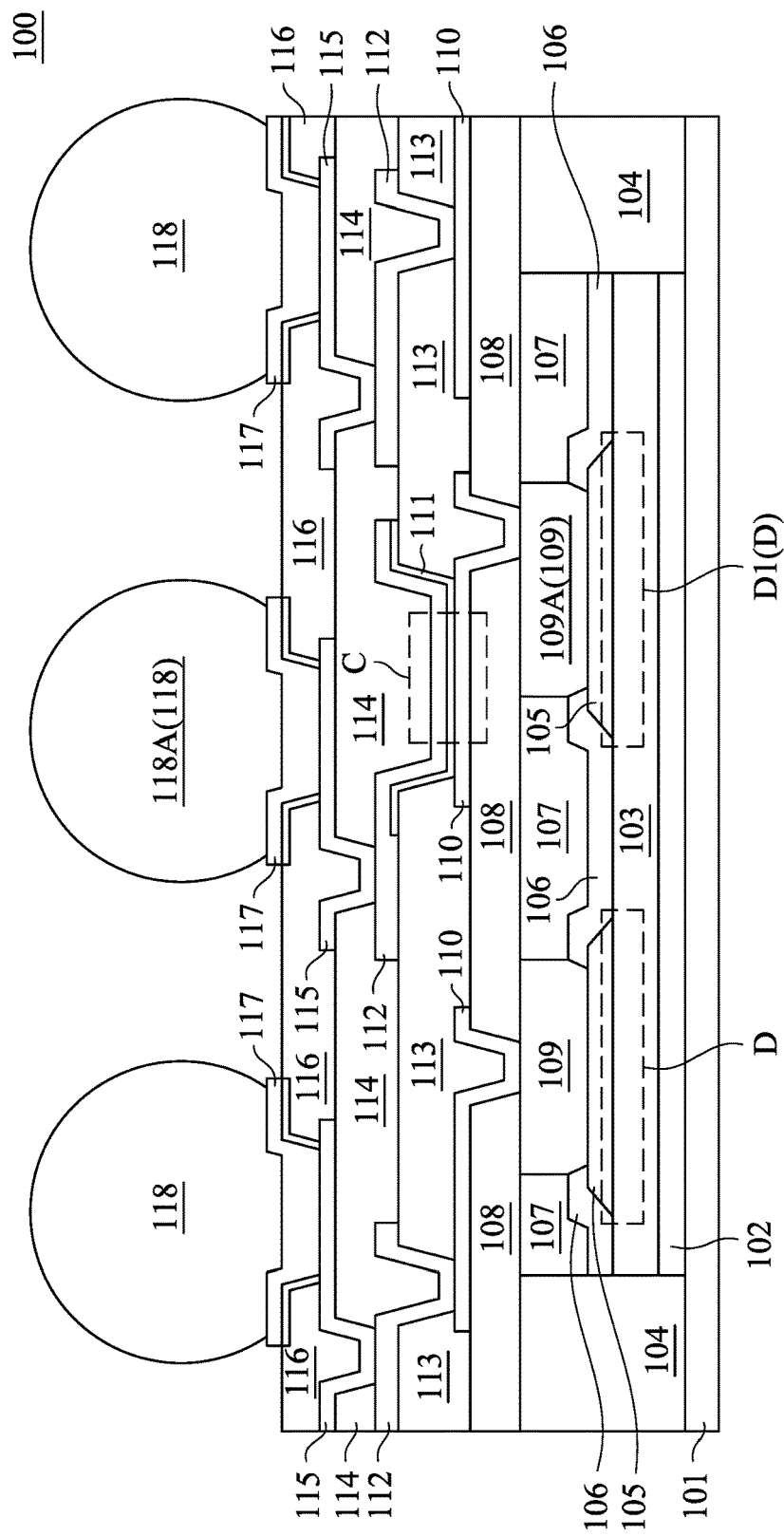

With reference to operation S242 of the method 200, external connectors 118, which are configured to be input/output (I/O) pads of the semiconductor device 100 are then formed, as illustratively shown in FIG. 23. In some embodiments, the external connectors 118 are implemented with solder balls on the under bump metallurgies 117. In some embodiments, the external connectors 118 are implemented with ball grid array (BGA) balls, controlled collapse chip connector (C4) bumps, and the like disposed upon the under bump metallurgies 117, which are formed over the redistribution layer 115. Thus, one of the external connectors 118 (for example, the external connector 118A) is electrically coupled to the device die D1 via the redistribution layer 115, the capacitor structure C (for example, including the redistribution layers 112, the dielectric layer 111, and the redistribution layers 110), the conductive structure 109A, and the conductive layer 105. Effectively, the redistribution layer 115, the capacitor structure C, the conductive structure 109A, and the conductive layer 105 provide electrical connections between the external connector 118A and the device die D1 in the InFO package. In some embodiments, the external connectors 118 are used to electrically couple the InFO package to other package components. For example, other package components include another device die, interposers, package substrates, printed circuit boards, a mother board, and the like.

In some embodiments, the external connector 118A is coupled to ground (not shown). Effectively, in these embodiments, the capacitor structure C is arranged between the ground and the device dies D1. Thus, noises associated with the device die D1 may be bypassed to ground through the capacitor structure C and the external connector 118A.

Next, the carrier 901 and the adhesive layer 902 are removed from the InFO package. The resulting structure is shown in FIG. 23. In some embodiments, the polymer base layer 101 is also removed from the InFO package. In some alternative embodiments, the polymer base layer 101 is not removed, and is left in the resulting package as a bottom protective layer.

The above description of the method 200 includes exemplary operations, but the operations of the method 200 are not necessarily performed in the order described. The order of the operations of the method 200 disclosed in the present disclosure are able to be changed, or the operations are able to be executed simultaneously or partially simultaneously as appropriate, in accordance with the spirit and scope of some embodiments of the present disclosure. In addition, the operations may be added, replaced, changed order, and/or eliminated as appropriate, in accordance with the spirit and scope of some embodiments of the present disclosure.

In some embodiments, a semiconductor device is disclosed that includes a plurality of redistribution layers, a dielectric layer, and a conductive structure. The redistribution layers are formed overlying a device die to provide an electrical connection between the device die and an external connector in a package. The dielectric layer is arranged between the redistribution layers to form a capacitor structure. The conductive structure is formed and coupled between the device die and the redistribution layers.

Also disclosed is a method that includes the operations below. A conductive structure is formed overlying a device die in a package. A first redistribution layer is formed overlying the conductive structure. A dielectric layer is formed overlying the first redistribution layer. A second redistribution layer is formed overlying the dielectric layer to form a capacitor structure in the package.

Also disclosed is a method that includes the operations below. A conductive structure is formed overlying a device die. A molding compound is applied to surround the device die and the conductive structure. A capacitor structure is formed overlying the conductive structure by a plurality of redistribution layers. The capacitor structure is coupled to the device die via the conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a plurality of redistribution layers formed overlying a device die to provide an electrical connection between the device die and an external connector in a package, the plurality of redistribution layers comprising a first redistribution layer, a second redistribution layer and a third redistribution layer, wherein the third redistribution layer is formed overlying the second redistribution layer and coupled between the second redistribution layer and the external connector;
   a dielectric layer arranged between and contacting the first redistribution layer and the second redistribution layer to form a capacitor structure;
   a conductive structure formed and coupled between the device die and the plurality of redistribution layers, wherein the first redistribution layer is formed overlying the conductive structure; and
   a first polymer layer formed between the second redistribution layer and the third redistribution layer.

2. The semiconductor device of claim 1, further comprising:
   a second polymer layer formed between the first redistribution layer and the conductive structure; and
   a third polymer layer formed between the first redistribution layer and the second redistribution layer.

3. The semiconductor device of claim 1, wherein a dielectric material of the dielectric layer comprises polyimide, polybenzoxazole, or a combination thereof.

4. The semiconductor device of claim 1, wherein a dielectric material of the dielectric layer comprises SiNX, SiO2, SiOxNy, SrTiO3, or a combination thereof.

5. The semiconductor device of claim 1, wherein a dielectric material of the dielectric layer comprises ZrO2, Al2O3, HfOx, HfSiOx, ZrTiOx, TiO2, TaOx, or a combination thereof.

6. The semiconductor device of claim 1, wherein a dielectric material of the dielectric layer comprises ZrO2-Al2O3-ZrO2.

7. The semiconductor device of claim 1, wherein a dielectric material of the dielectric layer comprises BaSrTiO3 (BST), PbZrTiO3 (PZT), PbZrLaTiO3, or a combination thereof.

8. The semiconductor device of claim 1, wherein a dielectric material of the dielectric layer has a dielectric constant greater than 2.8.

9. A semiconductor device comprising:
   a device die;
   a first redistribution layer connected to the device die;
   a first polymer layer over the first redistribution layer and having an opening to expose a portion of the first redistribution layer;
   a dielectric layer over the exposed portion of the first redistribution layer and including a material different than the first polymer layer, the dielectric layer having a flat portion and an oblique portion adjacent to the flat portion and the flat portion of the dielectric layer is in contact with the first redistribution layer;
   a second redistribution layer over the dielectric layer, the oblique portion of the dielectric layer being between the second redistribution layer and the first polymer layer; and
   a second polymer layer over the second redistribution layer.

10. The semiconductor device of claim 9, wherein a portion of the first polymer layer is between the dielectric layer and the first redistribution layer.

11. The semiconductor device of claim 9, wherein the dielectric layer has a smaller length than the second redistribution layer.

12. A semiconductor device comprising:
   a device die;
   a first redistribution layer connected to the device die, wherein the first redistribution layer has a first portion, a second portion above the first portion, and a third portion between the first and second portions;
   a first polymer layer over the first redistribution layer and having an opening to expose a portion of the first redistribution layer;
   a second redistribution layer over the first redistribution layer;
   a dielectric layer between the first and second redistribution layers and having a smaller thickness than at least one of the first and second redistribution layers, wherein the dielectric layer is in contact with the second portion of the first redistribution layer; and
   a second polymer layer over the second redistribution layer.

13. The semiconductor device of claim 12, wherein the dielectric layer has a smaller length than the second redistribution layer.

14. The semiconductor device of claim 12, further comprising:
   a molding compound surrounding the device die,
   wherein the dielectric layer has a dielectric constant greater than that of the molding compound.

15. The semiconductor device of claim 12, further comprising:
   a third redistribution layer formed overlying the second redistribution layer and coupled between the second redistribution layer and an external connector in a package,
   wherein the first polymer layer is formed between the second redistribution layer and the third redistribution layer.

16. The semiconductor device of claim 9, further comprising:
   a third redistribution layer formed overlying the second redistribution layer and coupled between the second redistribution layer and an external connector in a package,
   wherein the first polymer layer is formed between the second redistribution layer and the third redistribution layer.

17. The semiconductor device of claim 2, wherein the dielectric layer has a flat portion and an oblique portion adjacent to the flat portion, and the oblique portion of the dielectric layer is between the second redistribution layer and the third polymer layer.

18. The semiconductor device of claim 15, wherein a flat portion of the dielectric layer is in contact with the first redistribution layer.

19. The semiconductor device of claim 1, wherein the dielectric layer has a smaller thickness than at least one of the first and second redistribution layers.

20. The semiconductor device of claim 1, wherein the dielectric layer has a smaller length than the second redistribution layer.

* * * * *